(12) United States Patent
Jeon et al.

(10) Patent No.: US 12,069,884 B2
(45) Date of Patent: Aug. 20, 2024

(54) DISPLAY APPARATUS WITH SUBSTRATE OPENING SURROUNDED BY IRREGULARLY SHAPED EDGE OF ELECTRODE

(71) Applicant: Samsung Display Co., Ltd., Yongin-si (KR)

(72) Inventors: Woosik Jeon, Yongin-si (KR); Sangyeol Kim, Yongin-si (KR); Yunji Seo, Yongin-si (KR); Youngbin Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 17/446,540

(22) Filed: Aug. 31, 2021

(65) Prior Publication Data

US 2022/0209179 A1    Jun. 30, 2022

(30) Foreign Application Priority Data

Dec. 28, 2020  (KR) .................. 10-2020-0185213

(51) Int. Cl.
*H10K 50/844* (2023.01)
*H10K 59/131* (2023.01)
*H10K 71/00* (2023.01)

(52) U.S. Cl.
CPC ......... *H10K 50/844* (2023.02); *H10K 59/131* (2023.02); *H10K 71/00* (2023.02)

(58) Field of Classification Search
CPC ..... H10K 50/844; H10K 59/131; H10K 71/00
See application file for complete search history.

(56) References Cited

U.S. PATENT DOCUMENTS 10,840,317 B2   11/2020   Oh et al.
2020/0119304 A1 *  4/2020   Choi ................. H10K 59/87

FOREIGN PATENT DOCUMENTS

| KR | 10-1179983 B1 | 9/2012 |
| KR | 10-2016-0057197 A | 5/2016 |
| KR | 10-2020-0087912 A | 7/2020 |
| KR | 10-2020-0102580 A | 9/2020 |

* cited by examiner

*Primary Examiner* — Lex H Malsawma
(74) *Attorney, Agent, or Firm* — Lewis Roca Rothgerber Christie LLP

(57) ABSTRACT

A display apparatus includes: a substrate including an opening area, a display area, and a non-display area, the display area surrounding the opening area, and the non-display area being between the opening area and the display area; and a display element in the display area and including a first electrode, an emission layer, and a second electrode that are sequentially stacked, wherein the second electrode extends from the display area to the non-display area and includes a second electrode hole defined by an edge of the second electrode that faces and surrounds the opening area, and a first distance from a center of the opening area to a first portion of the edge of the second electrode is different from a second distance from the center of the opening area to a second portion of the edge of the second electrode.

10 Claims, 27 Drawing Sheets

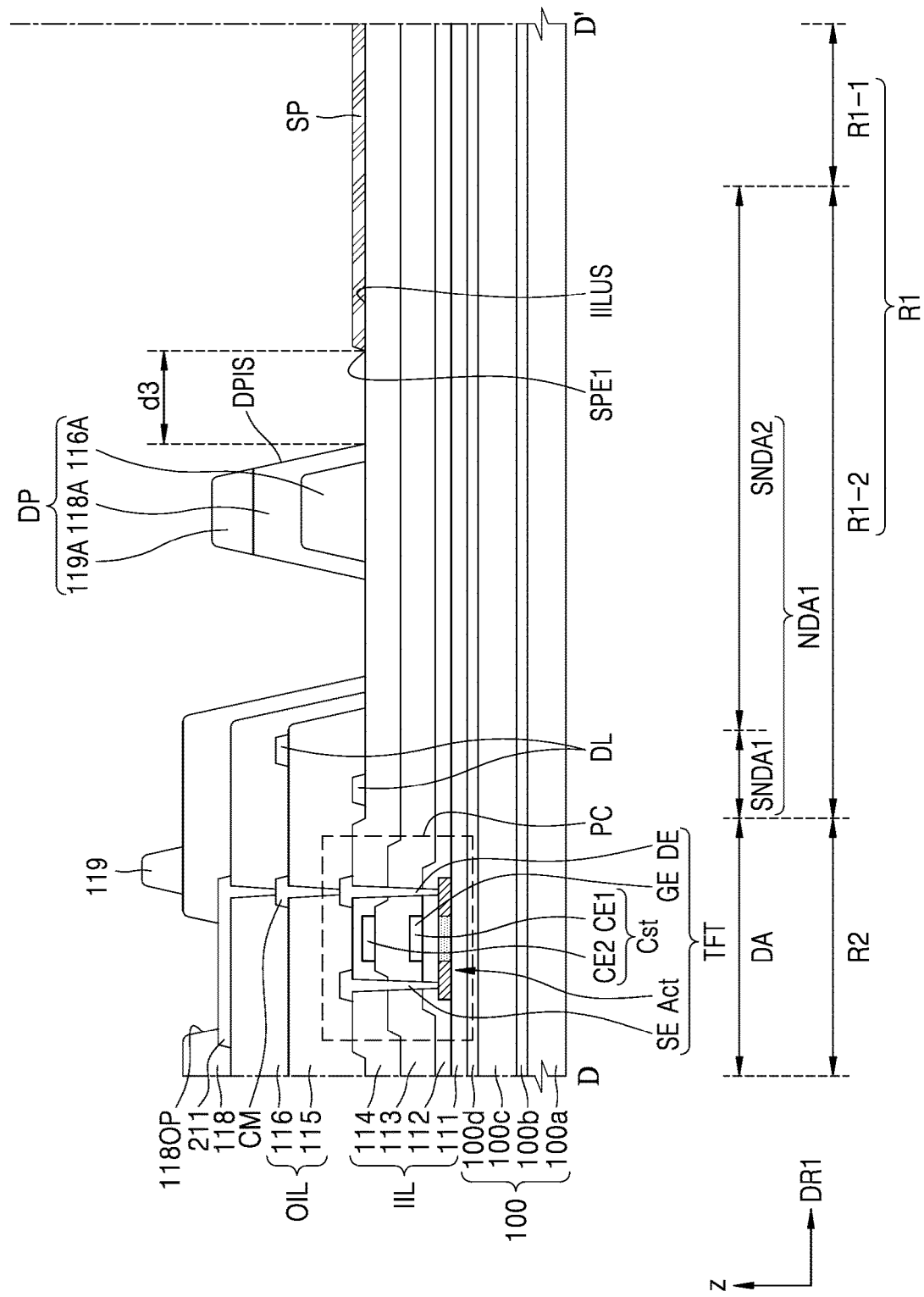

DISPLAY APPARATUS WITH SUBSTRATE OPENING SURROUNDED BY IRREGULARLY SHAPED EDGE OF ELECTRODE

CROSS-REFERENCE TO RELATED APPLICATION

The present application claims priority to and the benefit of Korean Patent Application No. 10-2020-0185213, filed on Dec. 28, 2020, in the Korean Intellectual Property Office, the disclosure of which is incorporated by reference herein in its entirety.

BACKGROUND

1. Field

Aspects of one or more embodiments relate to a display apparatus and a method of manufacturing the same.

2. Description of the Related Art

Recently, the various uses and applications of display devices has become more diversified. In addition, as display apparatuses have become thinner and lighter, their ranges of potential use has gradually expanded.

As the area occupied by a display area in display apparatuses expands, various functions that are combined or associated with display apparatuses have been added. In order to add various functions while expanding the area, research is being carried out on a display apparatus including an opening in a display area.

The above information disclosed in this Background section is only for enhancement of understanding of the background and therefore the information discussed in this Background section does not necessarily constitute prior art.

SUMMARY

Aspects of one or more embodiments relate to a display apparatus in which an organic material around an opening is removed through a laser lift-off process, and a method of manufacturing the display apparatus.

In display apparatuses having an opening, foreign material such as moisture or other contaminants, etc. may penetrate through a lateral surface of the opening and damage display elements. One or more embodiments include a display apparatus having a structure configured to prevent or reduce moisture transmission through an opening, and a method of manufacturing the display apparatus. However, such a technical problem is an example, and embodiments according to the disclosure are not limited thereto.

Additional aspects will be set forth in part in the description which follows and, in part, will be apparent from the description, or may be learned by practice of the presented embodiments of the disclosure.

According to one or more embodiments, a display apparatus includes a substrate including an opening area, a display area, and a non-display area, the display area surrounding the opening area, and the non-display area being between the opening area and the display area, and a display element arranged in the display area and including a first electrode, an emission layer, and a second electrode that are sequentially stacked, wherein the second electrode extends from the display area to the non-display area and includes a second electrode hole defined by an edge of the second electrode that faces and surrounds the opening area, and a first distance from a center of the opening area to a first portion of the edge of the second electrode is different from a second distance from the center of the opening area to a second portion of the edge of the second electrode.

According to some embodiments, in a plan view, the edge of the second electrode may have at least one step difference.

According to some embodiments, the edge of the second electrode may further include a third portion that crosses each of the first portion and the second portion, and meets each of the first portion and the second portion.

According to some embodiments, the display apparatus may further include a dam portion arranged in the non-display area and surrounding the opening area, wherein a third distance from an inner surface of the dam portion that faces the opening area, to the first portion may be different from a fourth distance from the inner surface of the dam portion that faces the opening area, to the second portion.

According to some embodiments, the display element may further include a functional layer including at least one of a first functional layer or a second functional layer, the first function layer being between the first electrode and the emission layer, and the second functional layer being between the emission layer and the second electrode, wherein the functional layer may extend from the display area to the non-display area and include a functional layer hole defined as an edge of the functional layer that faces and surrounds the opening area, and a shape of the functional layer hole may be same as a shape of the second electrode hole.

According to some embodiments, the display apparatus may further include an encapsulation layer covering the display element and including a first inorganic encapsulation layer, an organic encapsulation layer, and a second inorganic encapsulation layer, wherein the first inorganic encapsulation layer and the second inorganic encapsulation layer may extend from the display area to the non-display area to overlap the second electrode hole.

According to some embodiments, the display apparatus may further include an inorganic insulating layer between the substrate and the display element, wherein the first inorganic encapsulation layer may contact the inorganic insulating layer in the second electrode hole.

According to some embodiments, in a plan view, the edge of the second electrode that defines the second electrode hole may include a plurality of step differences.

According to some embodiments, a distance from the center of the opening area to the edge of the second electrode that defines the second electrode hole may be reduced in a peripheral direction of the second electrode hole.

According to some embodiments, the display apparatus may further include a component overlapping the opening area.

According to one or more embodiments, a method of manufacturing a display apparatus includes forming a sacrificial layer pattern over a substrate including a first area and a second area surrounding the first area, the sacrificial layer pattern overlapping the first area and including an edge that faces the second area, forming a first electrode in the second area, forming a functional layer and a second electrode on the first electrode and the sacrificial layer pattern, the functional layer including at least one of a first functional layer or a second functional layer, and irradiating a laser to the sacrificial layer pattern, wherein a first distance from a center of the first area to a first edge portion of an edge of the sacrificial layer pattern is different from a second distance from the center of the first area to a second edge portion of the edge of the sacrificial layer pattern.

According to some embodiments, in a plan view, the edge of the sacrificial layer pattern may include at least one step difference.

According to some embodiments, the edge of the sacrificial layer pattern may further include a third edge portion that crosses each of the first edge portion and the second edge portion and meets each of the first edge portion and the second edge portion, wherein the method may further include selecting a portion of the sacrificial layer pattern arranged between the first edge portion and the third edge portion as one of a start point and an end point and irradiating the laser.

According to some embodiments, a distance between a center of the first area and an irradiation path may be reduced in a peripheral direction of the sacrificial layer pattern.

According to some embodiments, the irradiating of the laser may include irradiating the laser along a spiral irradiation path.

According to some embodiments, the method may further include removing the second electrode that overlaps the sacrificial layer pattern to form a second electrode hole, and removing the functional layer that overlaps the sacrificial layer pattern to form a functional layer hole.

According to some embodiments, the method may further include forming an encapsulation layer on the second electrode, the encapsulation layer including a first inorganic encapsulation layer, an organic encapsulation layer, and a second inorganic encapsulation layer, wherein the first inorganic encapsulation layer and the second inorganic encapsulation layer may overlap the second electrode hole and the functional layer hole.

According to some embodiments, in a plan view, the edge of the sacrificial layer pattern may include a plurality of step differences.

According to some embodiments, a distance from a center of the first area to the edge of the sacrificial layer pattern may be reduced in a peripheral direction of the edge of the sacrificial layer pattern.

According to some embodiments, the method may further include forming an opening area in the substrate, the opening area overlapping the first area.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 10A is a cross-sectional view of the substrate and the sacrificial layer pattern, taken along the line D-D' of FIG. 9A according to some embodiments;

DETAILED DESCRIPTION

Figure 1:
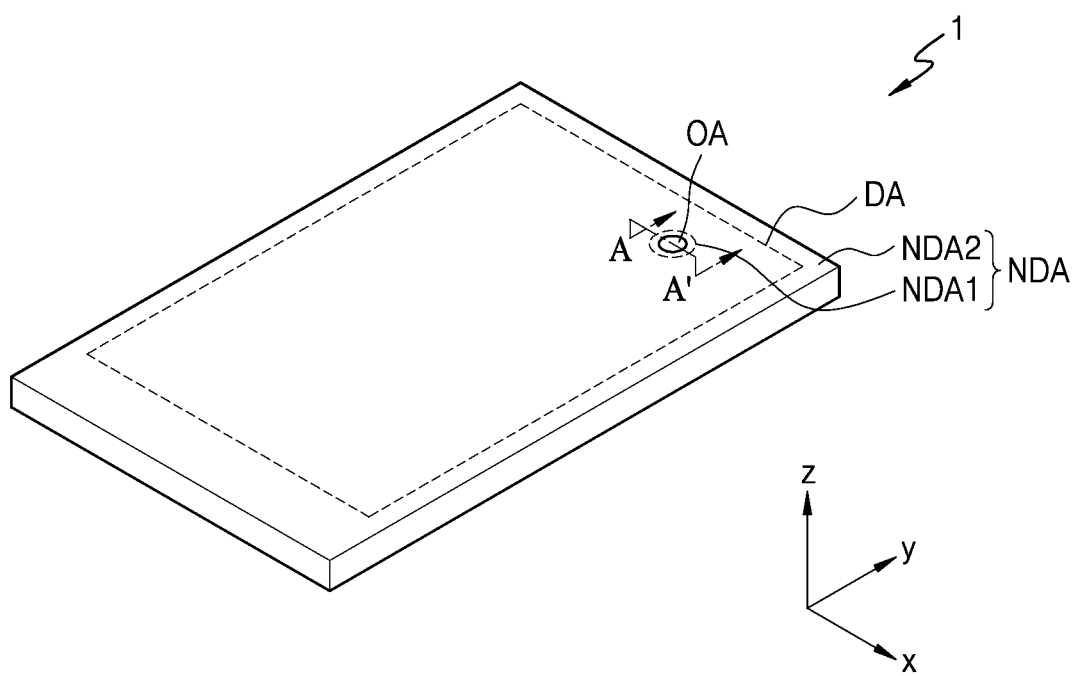
FIG. 1 is a perspective view of a display apparatus according to some embodiments.

Reference will now be made in more detail to aspects of some embodiments, which are illustrated in the accompanying drawings, wherein like reference numerals refer to like elements throughout. In this regard, the present example embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

A display apparatus is an apparatus for displaying images and may include portable electronic apparatuses such as game consoles, multimedia apparatuses, and ultra-miniature personal computers. A display apparatus may include a liquid crystal display, an electrophoretic display, an organic light-emitting display, an inorganic light-emitting display, a field emission display, a surface-conduction electron-emitter display, a quantum-dot display, a plasma display, and a cathode ray display. Hereinafter, though an organic light-emitting display apparatus is described as an example of a display apparatus according to some embodiments, embodiments of display apparatuses may be other types of display apparatuses.

FIG. 1 is a perspective view of a display apparatus 1 according to some embodiments.

Referring to FIG. 1, the display apparatus 1 may include a display area DA, a non-display area NDA, and an opening area OA. The display area DA may be configured to emit light. A plurality of pixels may be arranged in the display area DA. The display apparatus 1 may display an image using light emitted from the plurality of pixels. The non-display area NDA may not emit light. The non-display area NDA may be adjacent to the display area DA.

The opening area OA may be at least partially surrounded by the display area DA. According to some embodiments, the opening area OA may be entirely surrounded by the display area DA.

The non-display area NDA may include a first non-display area NDA1 and a second non-display area NDA2. The first non-display area NDA1 may surround the opening area OA. The second non-display area NDA2 may at least partially surround the display area DA. According to some embodiments, the first non-display area NDA1 may entirely surround the opening area OA. The display area DA may entirely surround the first non-display area NDA1. The second non-display area NDA2 may entirely surround the display area DA.

Figure 2:
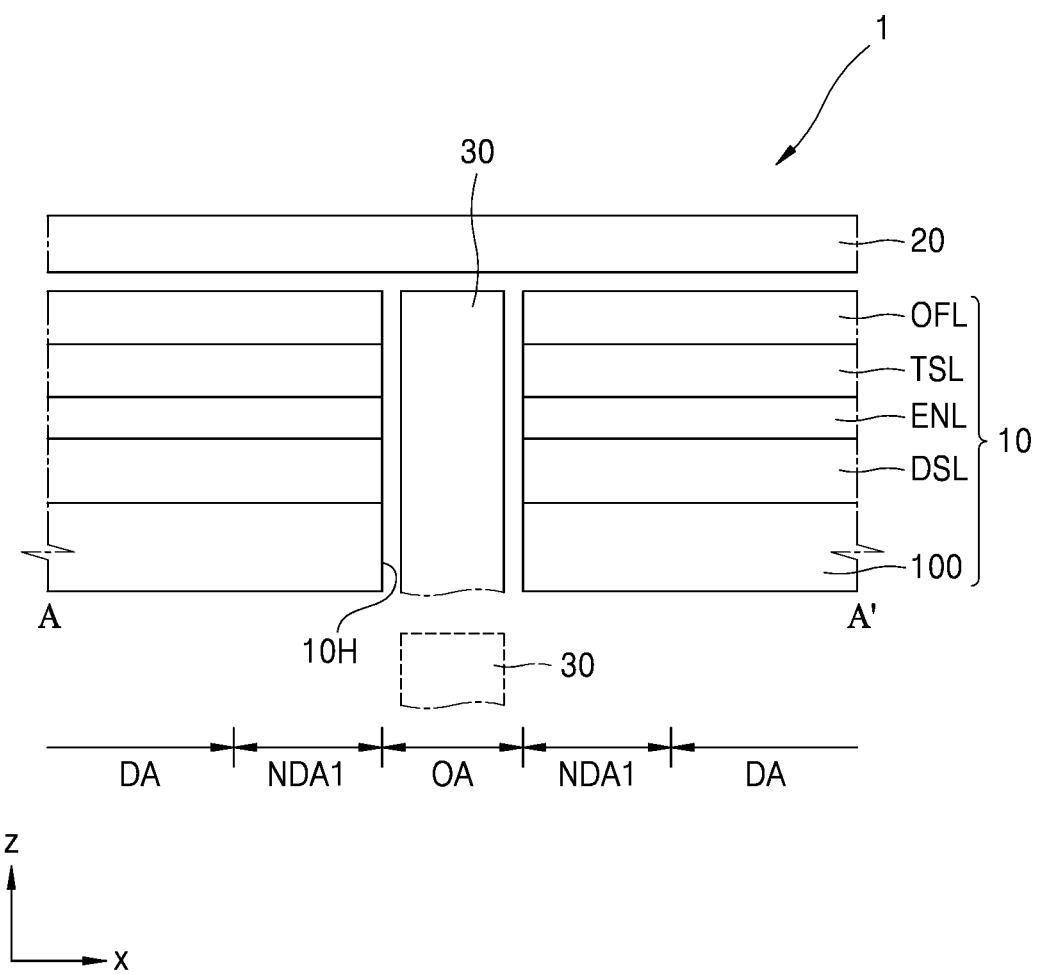
FIG. 2 is a cross-sectional view of a display apparatus according to some embodiments.

FIG. 2 is a cross-sectional view of the display apparatus 1 according to some embodiments. FIG. 2 may correspond to a cross-sectional view of the display apparatus 1, taken along the line A-A' according to some embodiments.

Referring to FIG. 2, the display apparatus 1 may include a display panel 10, a cover window 20, and a component 30. The display panel 10 may display an image. The display panel 10 may include pixels arranged in the display area DA. The pixels may each include a display element and a pixel circuit connected thereto. The display element may include an organic light-emitting diode, an inorganic light-emitting diode, or a quantum-dot light-emitting diode. Hereinafter, the case where a display element includes an organic light-emitting diode is mainly described.

The display panel 10 may include a substrate 100 and a multi-layer arranged on the substrate 100. In this case, the display area DA, the first non-display area NDA1, and the opening area OA may be defined in the substrate 100 and/or the multi-layer. As an example, the substrate 100 may include the display area DA, the first non-display area NDA1, and the opening area OA. Hereinafter, the case where the display area DA, the first non-display area NDA1, and the opening area OA are defined in the substrate 100 is mainly described in detail.

According to some embodiments, the display panel 10 may include the substrate 100, a display layer DSL, an encapsulation layer ENL, a touch sensor layer TSL, and an optical functional layer OFL. The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, and cellulose acetate propionate. According to some embodiments, the substrate 100 may have a multi-layered structure including the above polymer resin and a barrier layer. The substrate 100 including the polymer resin may be flexible, rollable, and bendable.

The display layer DSL may be arranged on the substrate 100. The display layer DSL may include a pixel circuit layer and a display element layer, the pixel circuit layer including a plurality of pixel circuits, and the display element layer including a plurality of display elements. In this case, the plurality of pixel circuits may be respectively connected to the plurality of display elements. The pixel circuit may include a thin-film transistor and a storage capacitor. Accordingly, the display layer DSL may include the plurality of display elements, the plurality of thin-film transistors, and storage capacitors. In addition, the display layer DSL may further include insulating layers therebetween.

The encapsulation layer ENL may be arranged on the display layer DSL. The encapsulation layer ENL may be arranged on the display element and may cover the display element. According to some embodiments, the encapsulation layer ENL may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), and silicon nitride ($SiN_x$), and silicon oxynitride (SiON). The at least one organic encapsulation layer may include a polymer-based material. The polymer-based material may include an acryl-based resin, an epoxy-based resin, polyimide, and polyethylene. The at least one organic encapsulation layer may include acrylate.

The touch sensor layer TSL may be arranged on the encapsulation layer ENL. The touch sensor layer TSL may sense an external input, for example, coordinate information corresponding to a touch event. The touch sensor layer TSL may include a sensor electrode and touch wirings connected to the sensor electrode. The touch sensor layer TSL may sense an external input through a self-capacitance method or a mutual capacitance method.

The touch sensor layer TSL may be formed on the encapsulation layer ENL. Alternatively, the touch sensor layer TSL may be separately formed on a touch substrate and then coupled to the encapsulation layer ENL through an adhesive layer such as an optically clear adhesive. According to some embodiments, the touch sensor layer TSL may be directly formed on the encapsulation layer ENL. In this case, the adhesive layer may not be arranged between the touch sensor layer TSL and the encapsulation layer ENL.

The optical functional layer OFL may be arranged on the touch sensor layer TSL. The optical functional layer OFL may reduce the reflectivity of light (external light) incident toward the display apparatus 1 from the outside and/or improve the color purity of light emitted from the display apparatus 1. According to some embodiments, the optical functional layer OFL may include a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in an arrangement (e.g., a set or predetermined arrangement). Each of the retarder and the polarizer may further include a protective film.

According to some embodiments, the optical functional layer OFL may include a black matrix and color filters. The color filters may be arranged by taking into account colors of light emitted from the pixels. The color filters may include red, green, or blue pigment or dye. Alternatively, the color filters may each further include quantum dots in addition to the pigment or dye. Alternatively, some of the color filters may not include the pigment or dye and may include scattering particles such as titanium oxide.

According to some embodiments, the optical functional layer OFL may include a destructive interference structure. The destructive interference structure may include a first reflection layer and a second reflection layer respectively arranged on different layers. First-reflected light and second-reflected light respectively reflected by the first reflection layer and the second reflection layer may destructively interfere, and thus, the reflectivity of external light may be reduced.

The display panel 10 may include an opening 10H. According to some embodiments, the substrate 100 may include the opening area OA. The display layer DSL, the encapsulation layer ENL, the touch sensor layer TSL, and the optical functional layer OFL may respectively include first to fourth openings. The opening area OA and the first to fourth openings may overlap one another to constitute the opening 10H of the display panel 10. According to some embodiments, at least one of the substrate 100, the display layer DSL, the encapsulation layer ENL, the touch sensor layer TSL, or the optical functional layer OFL may not include an opening. As an example, one or two of the substrate 100, the display layer DSL, the encapsulation layer ENL, the touch sensor layer TSL, and the optical functional layer OFL may not include an opening.

The cover window 20 may be arranged on the display panel 10. The cover window 20 may protect the display panel 10. The cover window 20 may include at least one of glass, sapphire, or plastic. The cover window 20 may be, for example, ultra-thin glass (UTG), or colorless polyimide (CPI).

A component 30 may overlap the opening area OA. The component 30 may be arranged inside the opening 10H of the display panel 10, as shown by a solid line of FIG. 2, or arranged below the display panel 10, as shown by a dashed line.

The component 30 may include an electronic element. The component 30 may be an electronic element that uses light or sound. As an example, the electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound. The electronic element that uses light may use light in various wavelength bands such as visible light, infrared light, or ultraviolet light. According to some embodiments, the opening 10H of the display panel 10 may be understood as a transmission portion through which light and/or sound output from the component 30 to the outside or progressing toward the electronic element from the outside may pass.

According to some embodiments, in the case where the display apparatus 1 is used as a smartwatch or an instrument panel for an automobile, the component 30 may be a member such as clock hands or a needle indicating information (e.g., set or predetermined information) (e.g. the velocity of a vehicle, etc.). In the case where the display apparatus 1 includes clock hands or an instrument panel for an automobile, the component 30 may pass through the cover window 20 to be exposed to the outside. The cover window 20 may include an opening that overlaps the opening 10H of the display panel 10.

The component 30 may include an element(s) related to a function of the display panel 10 as described above, or include an element such as an accessory that increases the aesthetic sense of the display panel 10.

Figure 3:
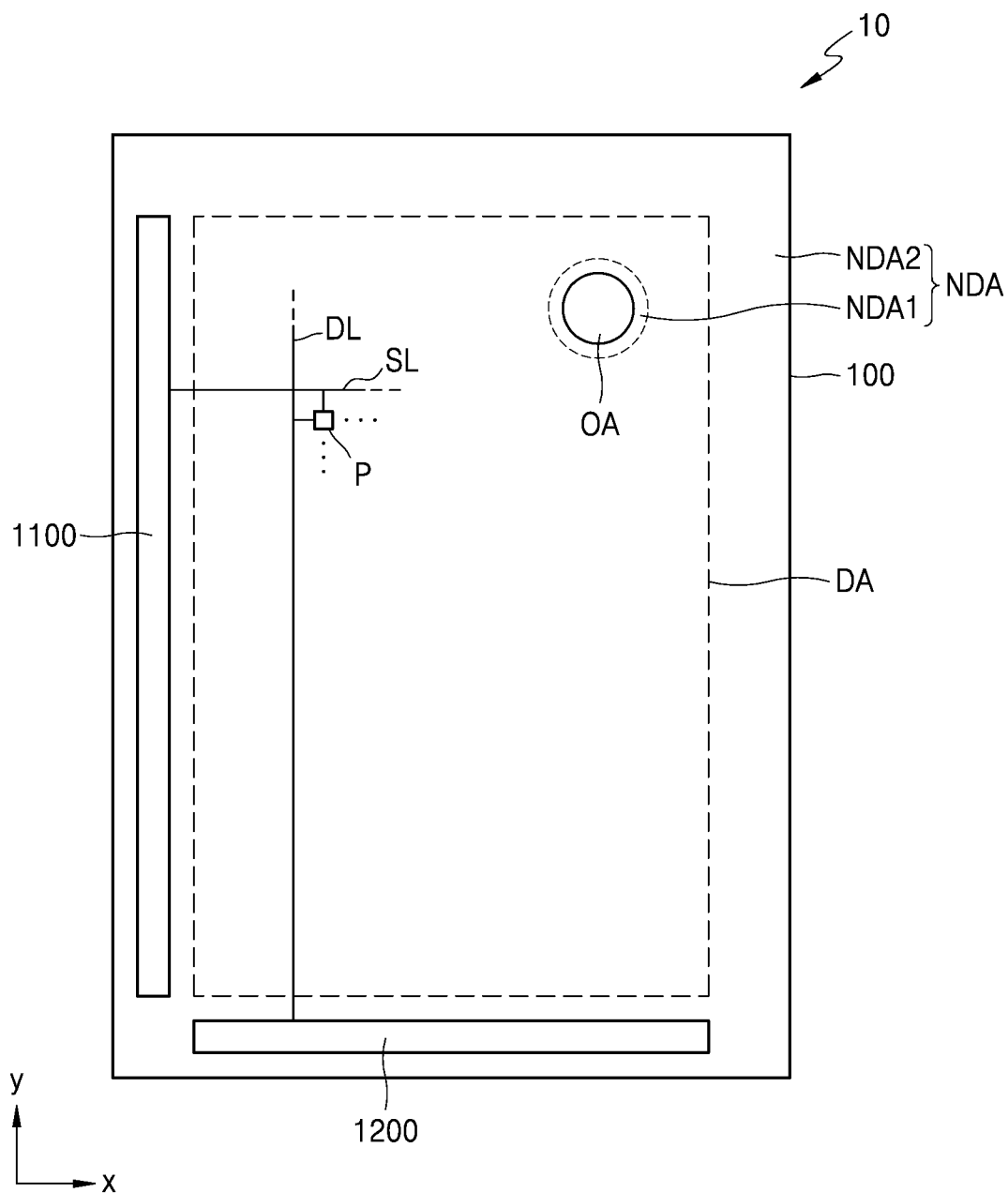
FIG. 3 is a plan view of a display panel according to some embodiments.
Figure 4:
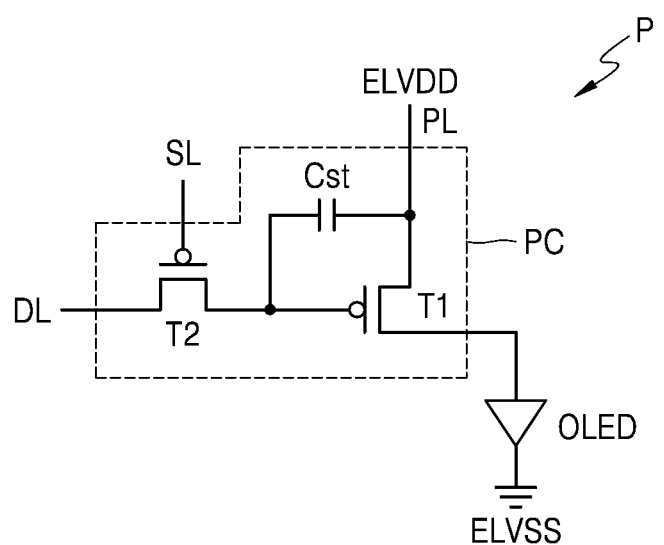
FIG. 4 is an equivalent circuit diagram of a pixel of a display panel according to some embodiments.

FIG. 3 is a plan view of the display panel 10 according to some embodiments, and FIG. 4 is an equivalent circuit diagram of a pixel P of the display panel 10 according to some embodiments.

Referring to FIG. 3, the display panel 10 may include the display area DA, the non-display area NDA, and the opening area OA. In this case, the substrate 100 of the display panel 10 may define the display area DA, the non-display area NDA, and the opening area OA. That is, the substrate 100 may include the display area DA, the non-display area NDA, and the opening area OA. The non-display area NDA may include the first non-display area NDA1 and the second non-display area NDA2, the first non-display area NDA1 surrounding the opening area OA, and the second non-display area NDA2 surrounding at least a portion of the display area DA.

The display panel 10 may include a plurality of pixels P arranged in the display area DA. As shown in FIG. 4, each pixel P may include a pixel circuit PC and an organic light-emitting diode OLED as a display element connected to the pixel circuit PC. The pixel circuit PC may include a driving thin-film transistor T1, a switching thin-film transistor T2, and a storage capacitor Cst. Each pixel P may emit red, green, blue, or white light from the organic light-emitting diode OLED.

The switching thin-film transistor T2 is connected to a scan line SL and a data line DL and may be configured to transfer a data voltage or a data signal to the driving thin-film transistor T1 according to a switching voltage or a switching signal input from the scan line SL, the data voltage or the data signal being input from the data line DL.

The storage capacitor Cst is connected to the switching thin-film transistor T2 and a driving voltage line PL and may store a voltage corresponding to a difference between a voltage transferred from the switching thin-film transistor T2 and a first power voltage ELVDD supplied to the driving voltage line PL.

The driving thin-film transistor T1 is connected to the driving voltage line PL and the storage capacitor Cst and may control a driving current flowing to the organic light-emitting diode OLED from the driving voltage line PL according to the voltage stored in the storage capacitor Cst.

The organic light-emitting diode OLED may emit light having preset brightness based on the driving current. A second electrode of the organic light-emitting diode OLED may be supplied with a second power voltage ELVSS.

Though it is shown in FIG. 4 that the pixel circuit PC includes two thin-film transistors and one storage capacitor, the number of thin-film transistors and the number of storage capacitors may be variously changed depending on the design of the pixel circuit PC.

Referring to FIG. 3 again, the first non-display area NDA1 may surround the opening area OA. The first non-display area NDA1 is an area in which the display element such as the organic light-emitting diode that emits light is not arranged. Signal lines may pass across the first non-display area NDA1, the signal lines being configured to provide a signal to pixels P arranged around the opening area OA.

A scan driver 1100, a data driver 1200, and a main power wiring may be arranged in the second non-display area NDA2, the scan driver 1100 being configured to provide a scan signal to each pixel P, the data driver 1200 being configured to provide a data signal to each pixel P, and the main power wiring being configured to provide a first power voltage and/or a second power voltage. Though it is shown in FIG. 4 that the data driver 1200 is adjacent to one side of the substrate 100, the data driver 1200 may be arranged on a flexible printed circuit board (FPCB) electrically connected to a pad on one side of the display panel 10 according to some embodiments.

Figure 5:
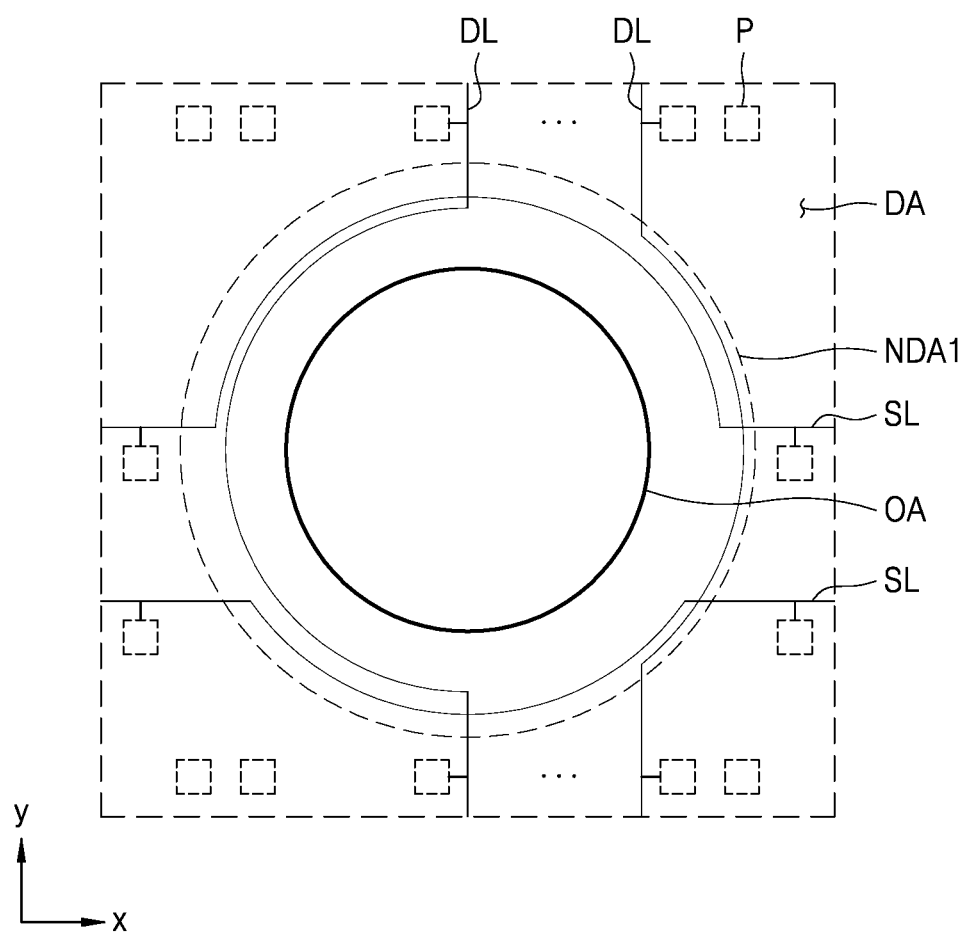
FIG. 5 is a plan view of a portion of a display panel according to some embodiments.

FIG. 5 is a plan view of a portion of the display panel 10 according to some embodiments. FIG. 5 shows signal lines arranged in the first non-display area NDA1.

Referring to FIG. 5, a pixel P may be arranged in the display area DA. A pixel P may be connected to the scan line SL and the data line DL. The first non-display area NDA1 may be arranged between the opening area OA and the display area DA.

Pixels P may be apart from each other around the opening area OA. The pixels P may be vertically apart from each other around the opening area OA. The pixels P may be horizontally apart from each other around the opening area OA.

Signal lines adjacent to the opening area OA from among the signal lines configured to supply a signal to the pixels P may detour around the opening area OA. Some of the data lines DL passing across the display area DA may extend in a y-direction to provide a data signal to the pixels P vertically arranged with the opening area OA therebetween, and may detour along the edge of the opening area OA in the first non-display area NDA1. Some of the scan lines SL passing across the display area DA may extend in an x-direction to provide a scan signal to the pixels P horizontally arranged with the opening area OA therebetween, and may detour along the edge of the opening area OA in the first non-display area NDA1.

Figure 6A:
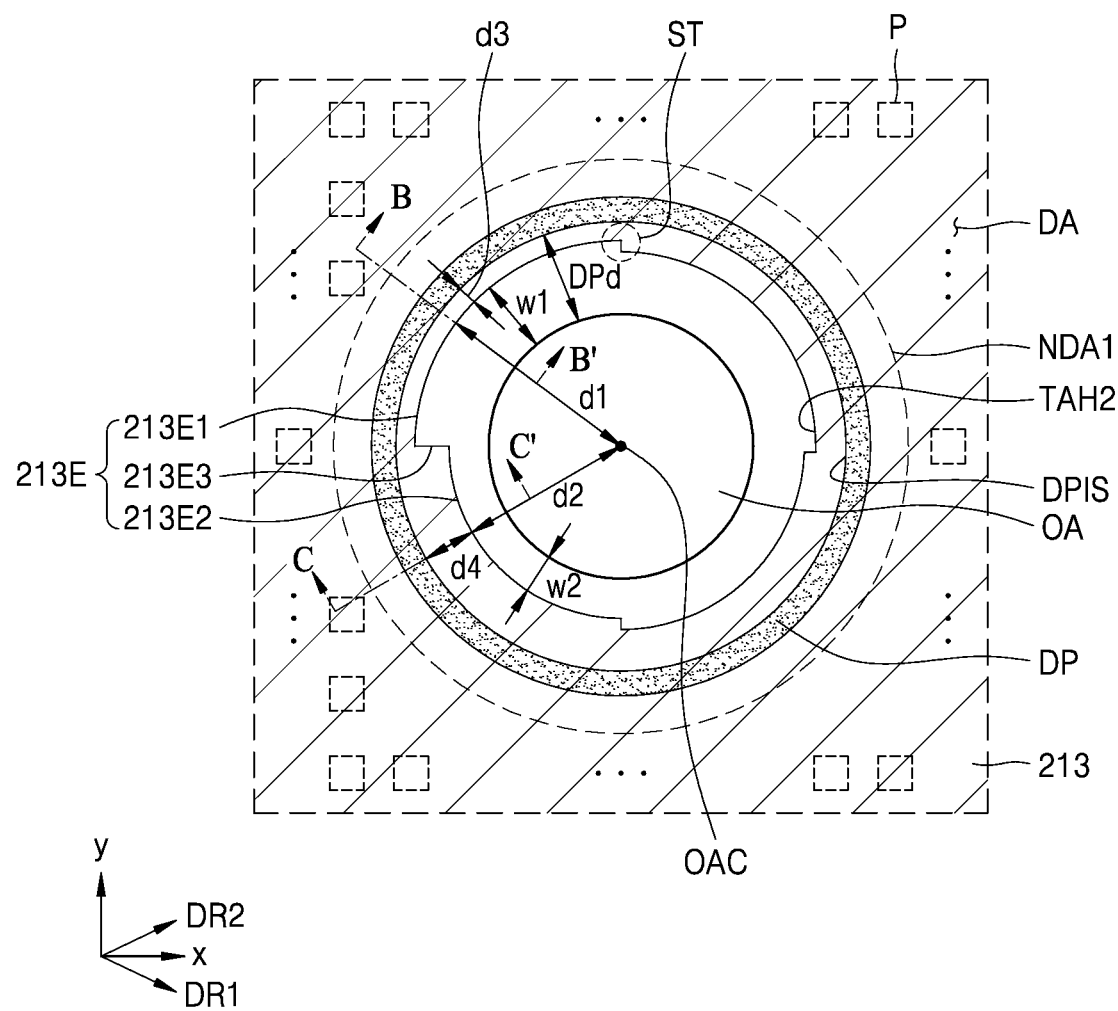
FIGS. 6A to 6C are plan views of a portion of a display panel according to some embodiments.
Figure 6B:
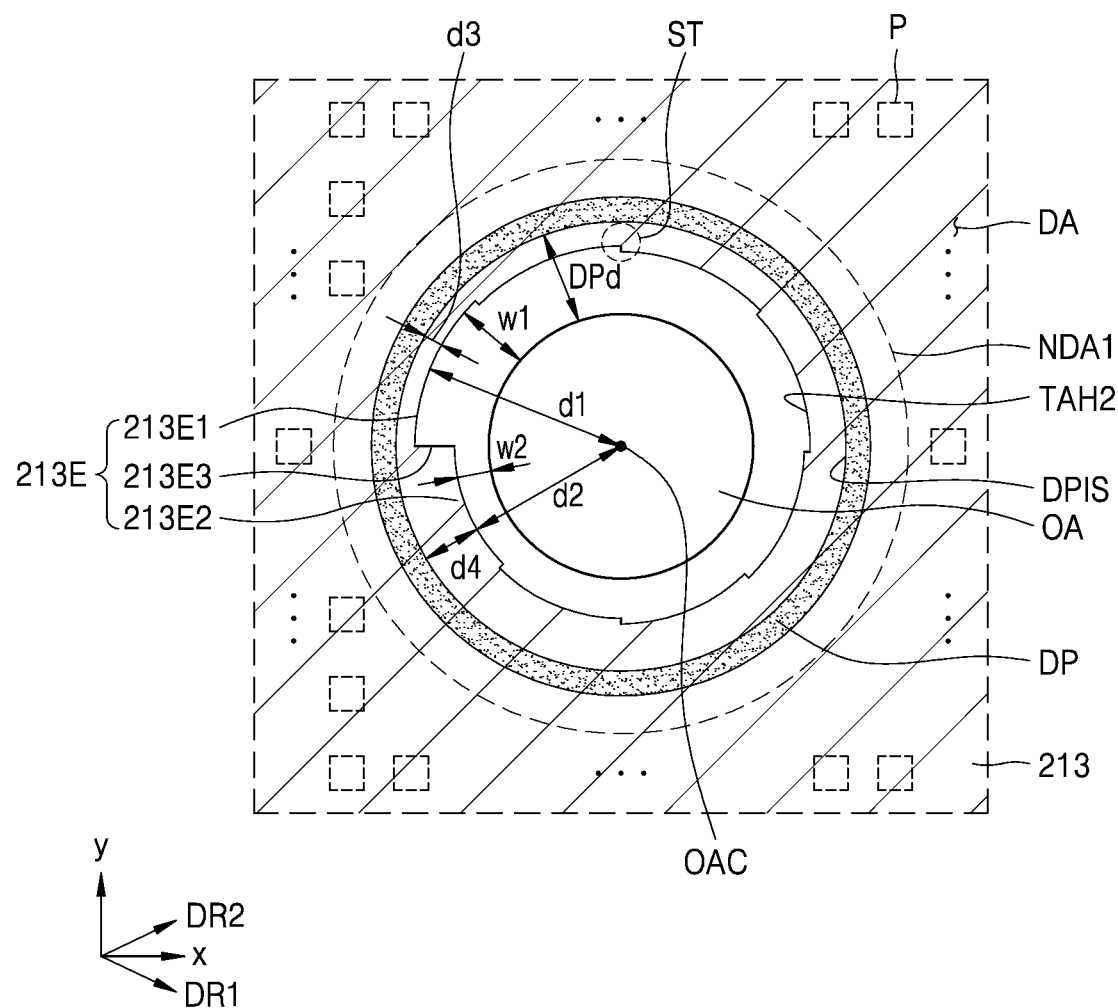
Figure 6C:
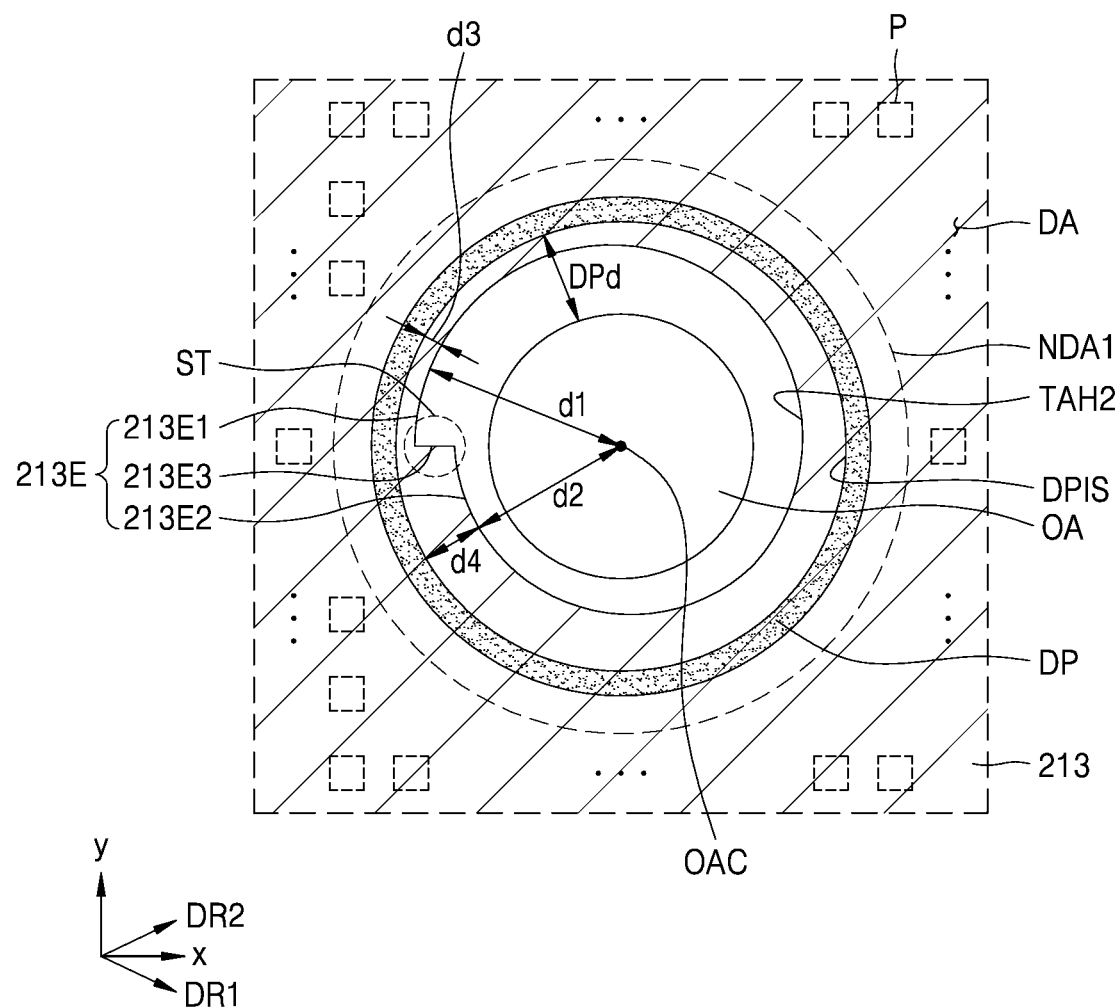

FIGS. 6A to 6C are plan views of a portion of the display panel 10 according to some embodiments. FIGS. 6A to 6C are plan views of a dam portion DP and a second electrode 213. In FIGS. 6A to 6C, the same reference numeral as those of FIG. 5 denote the same elements, and thus, repeated descriptions thereof are omitted.

Referring to FIG. 6A, a substrate may include the opening area OA, the display area DA, and the first non-display area NDA1. According to some embodiments, the opening area OA may have a circular shape. When viewed from a plane (e.g., a xy-plane) or in a plan view (e.g., a xy-plane), the opening area OA may have a circular shape. In this case, the opening area OA may have a center OAC of the opening area OA. According to some embodiments, the opening area OA may have a polygonal shape. According to some embodiments, the opening area OA may have an elliptical shape or an at least partially curved shape. Hereinafter, the case where the opening area OA has a circular shape is mainly described in detail.

The pixels P may be arranged in the display area DA. The display area DA may surround the opening area OA. According to some embodiments, the pixel P may include an organic light-emitting diode as a display element. The organic light-emitting diode may include a first electrode, an emission layer, and the second electrode 213 that are sequentially stacked. The first non-display area NDA1 may be arranged between the opening area OA and the display area DA. At least one dam portion DP may be arranged in the first non-display area NDA1. That is, the dam portion DP may be arranged between the opening area OA and the display area DA.

The organic light-emitting diode may further include a functional layer including at least one of a first functional layer or a second functional layer, the first functional layer being between the first electrode and the emission layer, and the second functional layer being between the emission layer and the second electrode.

The functional layer and the second electrode 213 may be common layers arranged in the display area DA entirely. According to some embodiments, the functional layer and the second electrode 213 may be continuously arranged in the display area DA. According to some embodiments, when viewed from a plane or in a plan view, the functional layer and the second electrode 213 may have substantially the same shape. Hereinafter, though the shape of the second electrode 213 is mainly described when viewed from a plane or in a plan view, the shape of the functional layer may be also the same as or similar to the shape of the second electrode 213.

The second electrode 213 may extend from the display area DA to the first non-display area NDA1. In other words, the second electrode 213 may extend in a direction from the display area DA to the opening area OA. According to some embodiments, the second electrode 213 may overlap the first non-display area NDA1.

The second electrode 213 may include a second electrode hole TAH2. The second electrode hole TAH2 may overlap the opening area OA. The size of the second electrode hole TAH2 may be greater than the size of the opening area OA. The size of the second electrode hole TAH2 may be defined by an area occupied by the second electrode hole TAH2. The size of the opening area OA may be defined by an area occupied by the opening area OA. The second electrode hole TAH2 may overlap the opening area OA entirely.

The second electrode hole TAH2 may overlap the opening area OA entirely and overlap the first non-display area NDA1. The second electrode hole TAH2 may expose a portion of the first non-display area NDA1 surrounding the opening area OA.

Similarly, the functional layer may have a functional layer hole. The functional layer hole may overlap the opening area OA. According to some embodiments, when viewed from a plane or in a plan view, the functional layer hole may have substantially the same shape as that of the second electrode hole TAH2. The functional layer hole may overlap the opening area OA entirely and overlap the first non-display area NDA1. The functional layer hole may expose a portion of the first non-display area NDA1 surrounding the opening area OA.

An edge 213E of the second electrode 213 may define the second electrode hole TAH2. The edge 213E of the second electrode 213 may face and surround the opening area OA. Accordingly, the area of the second electrode hole TAH2 may be an inner area of a closed curve defined by the edge 213E of the second electrode 213.

The edge 213E of the second electrode 213 may be apart from the opening area OA. The edge 213E of the second electrode 213 may overlap the first non-display area NDA1 but be apart from the opening area OA. The edge 213E of the second electrode 213 may be an end of the second electrode 213 facing the opening area OA.

A first distance d1 from the center OAC of the opening area OA to a first portion 213E1 of the edge 213E of the second electrode 213 may be different from a second distance d2 from the center OAC of the opening area OA to a second portion 213E2 of the edge 213E of the second electrode 213. That is, when viewed from a plane (e.g., a xy-plane), or in a plan view (e.g., a xy-plane), the edge 213E of the second electrode 213 may have a step difference ST. According to some embodiments, the edge 213E of the second electrode 213 may be bent. In other words, the edge 213E of the second electrode 213 may include the first portion 213E1, a second portion 213E2, and a third portion 213E3. The first portion 213E1 may meet and cross the third portion 213E3. The second portion 213E2 may meet and cross the third portion 213E3. That is, one side of the third portion 213E3 may meet the first portion 213E1, and another side of the third portion 213E3 may meet the second portion 213E2.

The first distance d1 may be a shortest distance from the center OAC of the opening area OA to the first portion 213E1 in a first direction DR1. According to some embodiments, the first direction DR1 may be a direction crossing an x-direction and/or a y-direction of FIGS. 6A to 6C. According to some embodiments, the first direction DR1 may be the x-direction or the y-direction of FIGS. 6A to 6C. The second distance d2 may be a shortest distance from the center OAC of the opening area OA to the second portion 213E2 in a second direction DR2. According to some embodiments, the second direction DR2 may cross the first direction DR1. As an example, the second direction DR2 may form an acute angle, a right angle, or a dull angle with the first direction DR1. According to some embodiments, the first direction DR1 may be opposite to the second direction DR2.

According to some embodiments, the first distance d1 may be greater than the second distance d2. In this case, the first portion 213E1 may be farther away from the center of the opening area OA than the second portion 213E2. According to some embodiments, the first distance d1 may be less than the second distance d2. In this case, the first portion 213E1 may be closer to the center OAC of the opening area OA than the second portion 213E2.

A first width w1 from the edge of the opening area OA to the first portion 213E1 may be different from a second width w2 from the edge of the opening area OA to the second portion 213E2. The edge of the opening area OA may be a boundary separating the opening area OA from the first non-display area NDA1. The first width w1 is a width of an area of the first non-display area NDA1 exposed by the second electrode hole TAH2 and facing the first portion 213E1. The second width w2 is a width of an area of the first non-display area NDA1 exposed by the second electrode hole TAH2 and facing the second portion 213E2. According to some embodiments, the first width w1 may be greater than the second width w2. According to some embodiments, the first width w1 may be less than the second width w2.

When the second electrode 213 and the functional layer extend from the display area DA to the opening area OA and meet the opening area OA, moisture and external air may penetrate through the opening area OA. According to some embodiments, the functional layer may include the functional hole overlapping the opening area OA, and the second electrode 213 may have the second electrode hole TAH2 overlapping the opening area OA. Accordingly, the second electrode 213 and the functional layer may be apart from the opening area OA, and penetration of moisture and external air through the opening area OA may be prevented or reduced.

According to some embodiments, the first distance d1 may be different from the second distance d2. Alternatively, the first width w1 may be different from the second width w2. This characteristic may be for uniformly removing the functional layer and the second electrode 213 around the opening area OA through a laser-lift process and preventing or reducing damage to an insulating layer arranged in the first non-display area NDA1. This is described below.

According to some embodiments, a distance from the center OAC of the opening area OA to the edge 213E of the second electrode 213 may be reduced in a peripheral direction of the second electrode hole TAH2. As an example, the distance from the center OAC of the opening area OA to the edge 213E of the second electrode 213 may be reduced clockwise. As another example, the distance from the center OAC of the opening area OA to the edge 213E of the second electrode 213 may be reduced counterclockwise.

According to some embodiments, at least one dam portion DP may be arranged between the opening area OA and the display area DA. As an example, one dam portion DP may be arranged in the first non-display area NDA1, or a plurality of dam portions DP may be arranged in the first non-display area NDA1. In the present specification, the dam portion DP denotes an element protruding from a reference surface. As an example, the dam portion DP may be an element protruding from a top surface of one of insulating layers arranged over the substrate.

The dam portion DP may surround the opening area OA. The dam portion DP may include an inner surface DPIS of the dam portion DP facing the opening area OA. In this case, a distance DPd from the opening area OA to the dam portion DP may be a distance from the edge of the opening area OA to the inner surface DPIS of the dam portion DP. According to some embodiments, the distance DPd from the opening area OA to the dam portion DP may be constant.

The functional layer and the second electrode 213 may extend from the display area DA to the first non-display area NDA1. The functional layer and the second electrode 213 may cover the dam portion DP and extend in a direction from the dam portion DP to the opening area OA.

A third distance d3 from the inner surface DPIS of the dam portion DP to the first portion 213E1 may be different from a fourth distance d4 from the inner surface DPIS of the dam portion DP to the second portion 213E2. The third distance d3 may be a distance in which the second electrode 213 extends from the inner surface DPIS of the dam portion DP to the first portion 213E1. The fourth distance d4 may be a distance in which the second electrode 213 extends from the inner surface DPIS of the dam portion DP to the second portion 213E2. In this case, a sum of the first width w1 and the third distance d3 may be substantially the same as a sum of the second width w2 and the fourth distance d4. As an example, the sum of the first width w1 and the third distance d3 may be the same as the distance DPd from the opening area OA to the dam portion DP.

When viewed from a plane (e.g., a xy-plane), or in a plan view (e.g., a xy-plane), the edge 213E of the second electrode 213 may include at least one step difference ST. According to some embodiments, the step difference ST may be defined as the third portion 213E3, the first portion 213E1 crossing the third portion 213E3, and the second portion 213E2 crossing the third portion 213E3.

Referring to FIGS. 6A and 6B, the edge 213E of the second electrode 213 may include a plurality of step differences ST. Referring to FIG. 6A, the edge 213E of the second electrode 213 may include four step differences ST. Referring to FIG. 6B, the edge 213E of the second electrode 213 may include eight step differences ST. According to some embodiments, the edge 213E of the second electrode 213 may include various numbers of differences ST. Accordingly, a distance from the center OAC of the opening area OA to the edge 213E of the second electrode 213 defining the second electrode hole TAH2 may be reduced with a constant interval in the peripheral direction of the second electrode hole TAH2.

Referring to FIG. 6C, the distance from the center OAC of the opening area OA to the edge 213E of the second electrode 213 may be successively reduced in the peripheral direction of the second electrode hole TAH2. As an example, the distance from the center OAC of the opening area OA to the edge 213E of the second electrode 213 defining the second electrode hole TAH2 may be successively reduced clockwise. In this case, the edge 213E of the second electrode 213 may have one step difference ST. Though it is shown in FIG. 6C that one step difference ST is bent, the first portion 213E1 and the third portion 213E3 may be connected in a curved shape according to some embodiments. In addition, the second portion 213E2 and the third portion 213E3 may be connected in a curved shape.

Figure 7A:
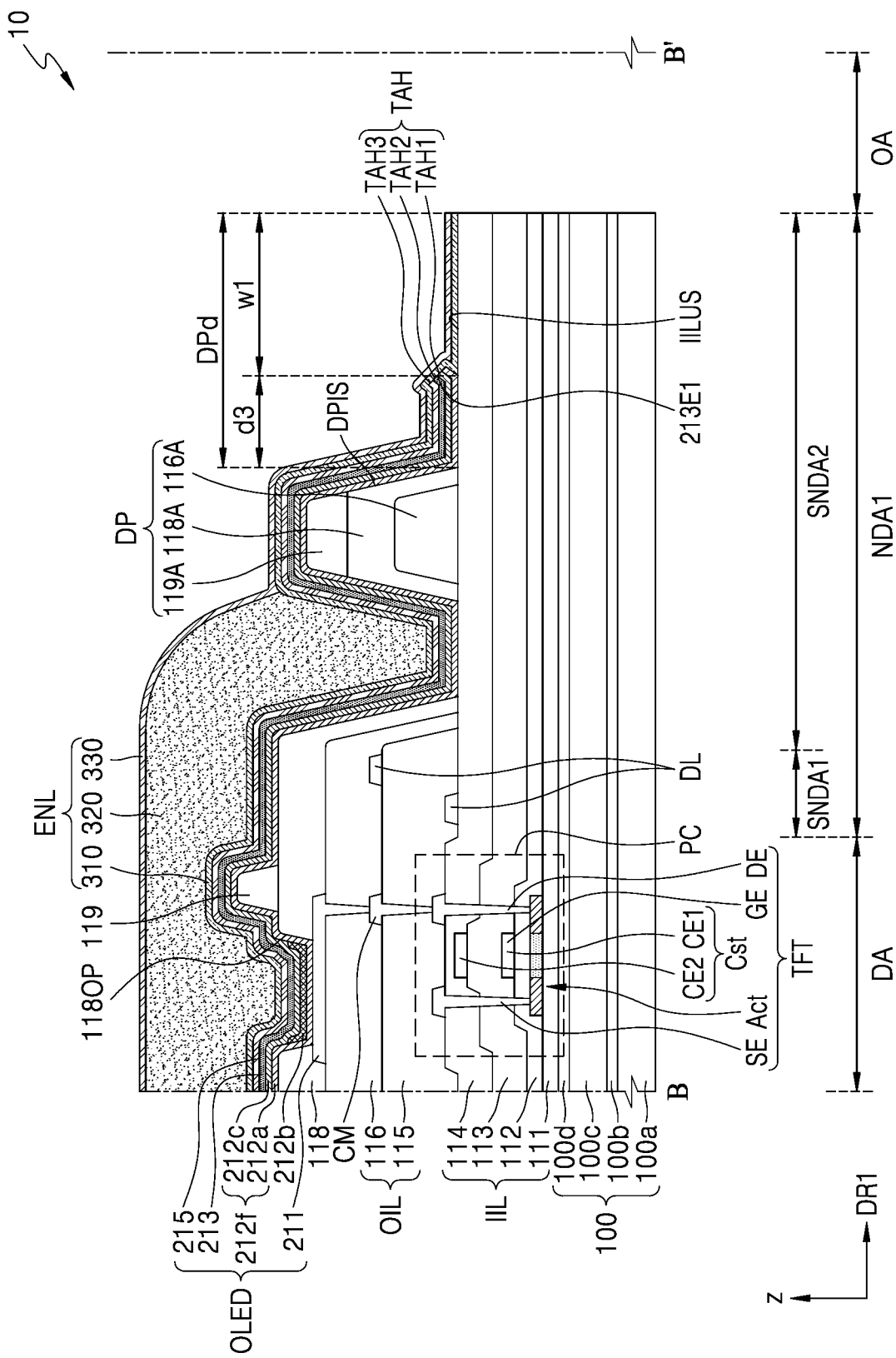
FIG. 7A is a cross-sectional view of a display panel, taken along the line B-B' of FIG. 6A according to some embodiments.
Figure 7B:
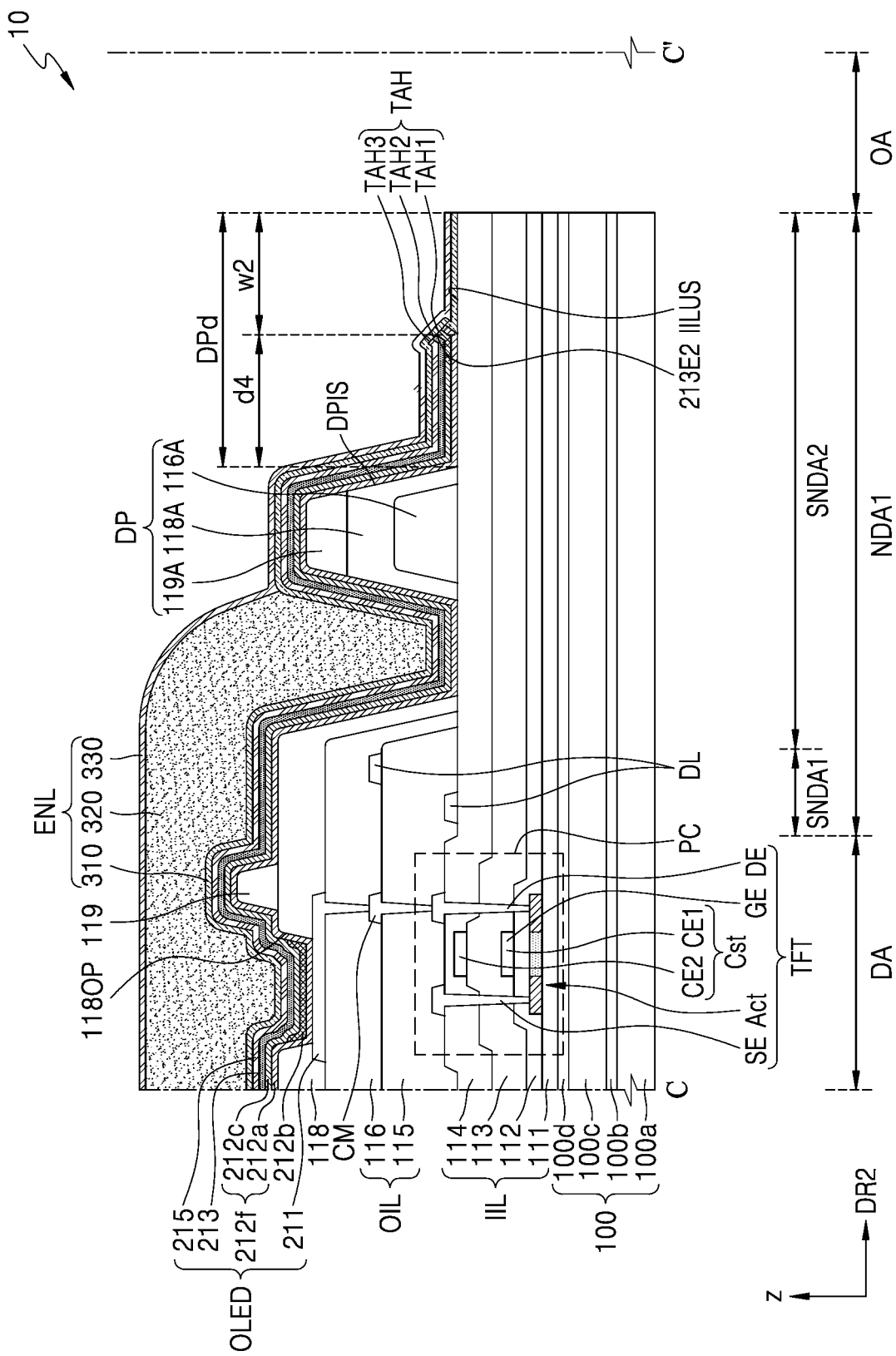
FIG. 7B is a cross-sectional view of a display panel, taken along the line C-C' of FIG. 6A according to some embodiments.

FIG. 7A is a cross-sectional view of the display panel 10, taken along the line B-B' of FIG. 6A according to some embodiments. FIG. 7B is a cross-sectional view of the display panel 10, taken along the line C-C' of FIG. 6A according to some embodiments.

Referring to FIGS. 7A and 7B, the display panel 10 may include the substrate 100, an inorganic insulating layer IIL, an organic insulating layer OIL, the pixel circuit PC, the data line DL, a connection electrode CM, the organic light-emitting diode OLED, a pixel-defining layer 118, a spacer 119, and an encapsulation layer ENL.

The substrate 100 may include the display area DA, the first non-display area NDA1, and the opening area OA. The first non-display area NDA1 may be arranged between the display area DA and the opening area OA.

The substrate 100 may include a first base layer 100a, a first barrier layer 100b, a second base layer 100c, and a second barrier layer 100d. According to some embodiments, the first base layer 100a, the first barrier layer 100b, the second base layer 100c, and the second barrier layer 100d may be sequentially stacked. According to some embodiments, the first base layer 100a, the first barrier layer 100b, the second base layer 100c, and the second barrier layer 100d may be successively arranged. As an example, the first base layer 100a, the first barrier layer 100b, the second base layer 100c, and the second barrier layer 100d may be successively arranged in a direction from the display area DA to the opening area OA.

At least one of the first base layer 100a or the first barrier layer 100b may include a polymer resin such as polyethersulfone, polyarylate, polyetherimide (PEI), polyethylene naphthalate (PEN), polyethylene terephthalate (PET), polyphenylene sulfide (PPS), polyimide (P1), polycarbonate (PC), cellulose tri acetate, and cellulose acetate propionate.

The first barrier layer 100b and the second barrier layer 100d may be barrier layers configured to prevent or reduce penetration of external foreign materials and may be a single layer or a multi-layer including an inorganic material such as silicon nitride ($SiN_x$), silicon oxide ($SiO_x$) and/or silicon oxynitride (SiON).

The inorganic insulating layer IIL may be arranged on the substrate 100. The inorganic insulating layer IIL may include a buffer layer 111, a first gate insulating layer 112, a second gate insulating layer 113, and an interlayer insulating layer 114. The inorganic insulating layer IIL may be arranged in the display area DA and the first non-display area NDA1. The pixel circuit PC may be arranged in the display area DA. The pixel circuit PC may include a thin-film transistor TFT and a storage capacitor Cst.

The buffer layer 111 may be arranged on the substrate 100. The buffer layer 111 may include an inorganic insulating material such as silicon nitride ($SiN_x$), silicon oxynitride (SiON), and silicon oxide ($SiO_2$) and include a signal layer or a multi-layer including the above inorganic insulating material.

The thin-film transistor TFT may include a semiconductor layer Act, a gate electrode GE, a source electrode SE, and a drain electrode DE. The semiconductor layer Act may be arranged on the buffer layer 111. The semiconductor layer Act may include polycrystalline silicon. Alternatively, the semiconductor layer Act may include amorphous silicon, an oxide semiconductor, or an organic semiconductor. The semiconductor layer Act may include a channel region, a drain region, and a source region, the drain region and the source region being respectively on two opposite sides of the channel region.

The gate electrode GE may overlap the channel region. The gate electrode GE may include a low-resistance metal material. The gate electrode GE may include a conductive material including molybdenum (Mo), aluminum (Al), copper (Cu), and titanium (Ti) and include a single layer or a multi-layer including the above materials.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The second gate insulating layer 113 may cover the gate electrode GE. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

A top electrode CE2 of the storage capacitor Cst may be arranged on the second gate insulating layer 113. The top electrode CE2 may overlap the gate electrode GE therebelow. In this case, the gate electrode GE and the top electrode CE2 overlapping each other with the second gate insulating layer 113 therebetween may constitute the storage capacitor Cst. That is, the gate electrode GE may serve as a bottom electrode CE1 of the storage capacitor Cst.

As described above, the storage capacitor Cst may overlap the thin-film transistor TFT. According to some embodiments, the storage capacitor Cst may not overlap the thin-film transistor TFT.

The top electrode CE2 may include a single layer or a multi-layer including aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu).

The interlayer insulating layer 114 may cover the top electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or a multi-layer including the above inorganic insulating material.

The drain electrode DE and the source electrode SE may be arranged on the interlayer insulating layer 114. The drain electrode DE and the source electrode SE may be connected to the semiconductor layer Act through contact holes of the first gate insulating layer 112, the second gate insulating layer 113, and the interlayer insulating layer 114. The drain electrode DE and the source electrode SE may include a material having excellent conductivity. The drain electrode DE and the source electrode SE may include a conductive material including molybdenum (Mo), aluminum (Al), copper (Cu), and titanium (Ti) and include a single layer or a multi-layer including the above materials. According to some embodiments, the drain electrode DE and the source electrode SE may have a multi-layered structure of Ti/Al/Ti.

The organic insulating layer OIL may be arranged on the inorganic insulating layer IIL. The organic insulating layer OIL may include a first organic insulating layer 115 and a second organic insulating layer 116. The first organic insulating layer 115 may cover the drain electrode DE and the source electrode SE. The first organic insulating layer 115 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The connection electrode CM may be arranged on the first organic insulating layer 115. In this case, the connection electrode CM may be connected to the drain electrode DE or the source electrode SE through a contact hole of the first organic insulating layer 115. The connection electrode CM may include a material having an excellent conductivity. The connection electrode CM may include a conductive material including molybdenum (Mo), aluminum (Al), copper (Cu), and titanium (Ti) and include a single layer or a multi-layer including the above materials. According to some embodiments, the connection electrode CM may have a multi-layered structure of Ti/Al/Ti.

The second organic insulating layer 116 may cover the connection electrode CM. The second organic insulating layer 116 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic light-emitting diode OLED may be arranged on the second organic insulating layer 116. The organic light-emitting diode OLED may emit red, green, or blue light, or emit red, green, blue, or white light. The organic light-emitting diode OLED may include a first electrode 211, an emission layer 212b, a functional layer 212f, and a second electrode 213. The first electrode 211 may be a pixel electrode of the organic light-emitting diode OLED, and the second electrode 213 may be an opposite electrode of the organic light-emitting diode OLED.

The first electrode 211 may be arranged on the second organic insulating layer 116. The first electrode 211 may be electrically connected to the connection electrode CM through a contact hole of the second organic insulating layer 116. The first electrode 211 may include a conducive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the first electrode 211 may further include a layer on/under the reflective layer, the layer including ITO, IZO, ZnO, or $In_2O_3$. As an example, the first electrode 211 may have a multi-layered structure of ITO/Ag/ITO that are stacked.

The pixel-defining layer 118 may be arranged on the first electrode 211, the pixel-defining layer 118 including an opening 1180P that exposes the central portion of the first electrode 211. The pixel-defining layer 118 may include an organic insulating material and/or an inorganic insulating material. The opening 1180P of the pixel-defining layer 118 may define an emission area of light emitted from the organic light-emitting diode OLED. As an example, the width of the opening 1180P may correspond to the width of the emission area.

The spacer 119 may be arranged on the pixel-defining layer 118. The spacer 119 may include an organic insulating material such as polyimide. Alternatively, the spacer 119 may include an inorganic insulating material such as silicon nitride ($SiN_x$) or silicon oxide ($SiO_2$), or an organic insulating material and an inorganic insulating material.

According to some embodiments, the spacer 119 may include a material different from that of the pixel-defining layer 118. Alternatively, according to some embodiments, the spacer 119 may include the same material as that of the pixel-defining layer 118. In this case, the pixel-defining layer 118 and the spacer 119 may be simultaneously formed during a mask process that uses a half-tone mask.

An emission layer 212b may be arranged in the opening 1180P of the pixel-defining layer 118. The emission layer 212b may include a polymer organic material or a low-molecular weight organic material that emits light having a preset color.

The functional layer 212f may include at least one of a first functional layer 212a or a second functional layer 212c, the first functional layer 212a being between the first electrode 211 and the emission layer 212b, and the second functional layer 212c being between the emission layer 212b and the second electrode 213. As an example, the first functional layer 212a may be arranged between the first electrode 211 and the emission layer 212b, and the second functional layer 212c may be omitted between the emission layer 212b and the second electrode 213. As another example, the first functional layer 212a between the first electrode 211 and the emission layer 212b may be omitted, and the second functional layer 212c may be arranged between the emission layer 212b and the second electrode 213. As another example, the first functional layer 212a may be arranged between the first electrode 211 and the emission layer 212b, and the second functional layer 212c may be arranged between the emission layer 212b and the second electrode 213. Hereinafter, the case where the first functional layer 212a and the second functional layer 212c are arranged is mainly described in detail.

The first functional layer 212a may include, for example, a hole transport layer (HTL), or include an HTL and a hole injection layer (HIL). The second functional layer 212c may include an electron transport layer (ETL) and/or an electron injection layer (EIL). Like the second electrode 213 described below, the first functional layer 212a and/or the second functional layer 212c may be common layers formed to cover the substrate 100 entirely.

The second electrode 213 may include a conductive material having a low work function. As an example, the second electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the second electrode 213 may further include a layer on/under the (semi) transparent layer, the layer including ITO, IZO, ZnO, or $In_2O_3$.

According to some embodiments, a capping layer 215 may be further arranged on the second electrode 213. The capping layer 215 may include lithium fluoride (LiF), an inorganic material, and/or an organic material.

The first non-display area NDA1 may include a first sub-non display area SNDA1 and a second sub-non display area SNDA2. The first sub-non display area SNDA1 may be farther away from the opening area OA than the second sub-non display area SNDA2. That is, the second sub-non display area SNDA2 may be arranged between the first sub-non display area SNDA1 and the opening area OA.

According to some embodiments, the second organic insulating layer 116 may cover the lateral surface of the first organic insulating layer 115. According to some embodiments, the second organic insulating layer 116 may expose the lateral surface of the first organic insulating layer 115.

According to some embodiments, the pixel-defining layer 118 may cover the lateral surface of the second organic insulating layer 116. According to some embodiments, the pixel-defining layer 118 may expose the lateral surface of the second organic insulating layer 116.

Signals, for example, the data lines DL described with reference to FIG. 5, may be arranged in the first sub-non display area SNDA1. According to some embodiments, the data line DL may be arranged between the inorganic insulating layer IIL and the first organic insulating layer 115 and/or between the first organic insulating layer 115 and the second organic insulating layer 116. In the case where the data lines DL are arranged on different layers, the width of the first non-display area NDA1 may be reduced. Though it is shown in FIGS. 7A and 7B that the data line DL is arranged in the first sub-non display area SNDA1, the scan line detouring the opening area OA described above with reference to FIG. 5 may be also arranged in the first sub-non display area SNDA1.

The dam portion DP may include a plurality of layers that are stacked. According to some embodiments, the dam portion DP may protrude from a top surface IILUS of the inorganic insulating layer K. As an example, the dam portion DP may protrude from the top surface of the interlayer insulating layer 114. As another example, the dam portion DP may protrude from the top surface of the buffer layer 111. In this case, the first gate insulating layer 112, the second gate insulating layer 113, and the interlayer insulating layer 114 may not be arranged in the second sub-non display area SNDA2. That is, the first gate insulating layer 112, the second gate insulating layer 113, and the interlayer insulating layer 114 may be disconnected in the first sub-non display area SNDA1. As another example, the dam portion DP may protrude from the top surface of one of the first gate insulating layer 112, the second gate insulating layer 113, and the interlayer insulating layer 114. Hereinafter, the case where the dam portion DP protrudes on the top surface of the interlayer insulating layer 114, and the first gate insulating layer 112, the second gate insulating layer 113, and the interlayer insulating layer 114 overlap the second sub-non display area SNDA2 is mainly described in detail.

According to some embodiments, the dam portion DP may include an organic pattern layer 116A, a first top organic pattern layer 118A, and a second top organic pattern layer 119A. The organic pattern layer 116A may be separated from the first organic insulating layer 115 and the second organic insulating layer 116. According to some embodiments, the organic pattern layer 116A may include the same material as that of the second organic insulating layer 116. According to some embodiments, the organic pattern layer 116A may include the same material as that of the first organic insulating layer 115. According to some embodiments, the organic pattern layer 116A may include a first organic pattern layer and a second organic pattern layer arranged on the first organic pattern layer. In this case, the first organic pattern layer may include the same material as that of the first organic insulating layer 115. The second organic pattern layer may include the same material as the second organic insulating layer 116.

The first top organic pattern layer 118A may be arranged on the organic pattern layer 116A. According to some embodiments, the first top organic pattern layer 118A may be arranged on the top surface of the organic pattern layer 116A. The first top organic pattern layer 118A may be separated from the pixel-defining layer 118. The first top organic pattern layer 118A may include the same material as that of the pixel-defining layer 118.

The second top organic pattern layer 119A may be arranged on the first top organic pattern layer 118A. The second top organic pattern layer 119A may be separated from the spacer 119. The second top organic pattern layer 119A may include the same material as that of the spacer 119.

The first functional layer 212a, the second functional layer 212c, the second electrode 213, and the capping layer 215 may each extend from the display area DA to the first non-display area NDA1. According to some embodiments, the first functional layer 212a, the second functional layer 212c, the second electrode 213, and the capping layer 215 may each cover the dam portion DP and extend in a direction from the inner surface DPIS of the dam portion DP to the opening area OA.

The first functional layer 212a, the second functional layer 212c, the second electrode 213, and the capping layer 215 may each be disconnected in the first non-display area NDA1. According to some embodiments, the first functional layer 212a, the second functional layer 212c, the second electrode 213, and the capping layer 215 may each include a transmission hole TAH exposing the top surface IILUS of the inorganic insulating layer IIL. According to some embodiments, the functional layer 212f may include a functional layer hole TAH1 exposing the top surface IILUS of the inorganic insulating layer IIL. The second electrode 213 may include the second electrode hole TAH2 exposing the top surface IILUS of the inorganic insulating layer K. In addition, the capping layer 215 may include a capping layer hole TAH3 exposing the top surface IILUS of the inorganic insulating layer IIL.

The area of the transmission hole TAH may be greater than the area of the opening area OA. When the functional layer 212f including an organic material is formed in the first non-display area NDA1 entirely to extend to the opening area OA, moisture may penetrate toward the organic light-emitting diode OLED arranged in the display area DA through the functional layer 212f in view of the characteristics of the organic material. According to some embodiments, the functional layer 212f may include the functional layer hole TAH1 overlapping the second sub-non display area SNDA2. Accordingly, the penetration of moisture or foreign material to the organic light-emitting diode OLED through the functional layer 212f may be prevented or reduced.

According to some embodiments, the width w1 from the edge of the opening area OA to the first portion 213E1 may be different from the second width w2 from the edge of the opening area OA to the second portion 213E2. The first width w1 is the width of the top surface IILUS of the inorganic insulating layer IIL exposed through the second electrode hole TAH2 in the first non-display area NDA1 and facing the first portion 213E1. The second width w2 is the width of the top surface IILUS of the inorganic insulating layer IIL exposed through the second electrode hole TAH2 in the first non-display area NDA1 and facing the second portion 213E2. According to some embodiments, the first width w1 may be greater than the second width w2. According to some embodiments, the first width w1 may be less than the second width w2. Accordingly, the functional layer 212f, the second electrode 213, and the capping layer 215 around the opening area OA are uniformly removed through a laser-lift process, and damage to the substrate 100 and the inorganic insulating layer IIL arranged in the first non-display area NDA1 may be prevented or reduced.

The distance DPd from the opening area OA to the dam portion DP may be a distance from the edge of the opening area OA to the inner surface DPIS of the dam portion DP. According to some embodiments, the distance DPd from the opening area OA to the dam portion DP may be constant.

A third distance d3 from the inner surface DPIS of the dam portion DP to the first portion 213E1 may be different from a fourth distance d4 from the inner surface DPIS of the dam portion DP to the second portion 213E2. The third distance d3 may be a distance by which the second electrode 213 extends from the end of the inner surface DPIS of the dam portion DP to the first portion 213E1. The fourth distance d4 may be a distance by which the second electrode 213 extends from the end of the inner surface DPIS of the dam portion DP to the second portion 213E2. According to some embodiments, a sum of the first width w1 and the third distance d3 may be substantially the same as a sum of the second width w2 and the fourth distance d4. As an example, the sum of the first width w1 and the third distance d3 may be the same as the distance DPd from the opening area OA to the dam portion DP.

The encapsulation layer ENL may cover the organic light-emitting diode OLED. The encapsulation layer ENL may be arranged on the second electrode 213 and/or the capping layer 215. According to some embodiments, the encapsulation layer ENL may include at least one inorganic encapsulation layer and at least one organic encapsulation layer. It is shown in FIGS. 7A and 7B that the encapsulation layer ENL includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may each extend from the display area DA to the first non-display area NDA1. The first inorganic encapsulation layer 310 and the second inorganic encapsulation layer 330 may be arranged in the first non-display area NDA1 entirely and continuously. The first inorganic encapsulation layer 310 and the second inorganic encapsulation layer 330 may each extend to the dam portion DP and may contact each other on the top surface of the dam portion DP. The first inorganic encapsulation layer 310 and the second inorganic encapsulation layer 330 may each extend to the opening area OA.

The first inorganic encapsulation layer 310 and the second inorganic encapsulation layer 330 may each overlap the transmission hole TAH. In detail, the first inorganic encapsulation layer 310 and the second inorganic encapsulation layer 330 may overlap the functional layer hole TAH1, the second electrode hole TAH2, and the capping layer hole TAH3. In this case, the first inorganic encapsulation layer 310 may contact the top surface IILUS of the inorganic insulating layer IIL in the transmission hole TAH. As an example, the first inorganic encapsulation layer 310 may contact the top surface IILUS of the inorganic insulating layer IIL in the functional layer hole TAH1 and/or the second electrode hole TAH2. Accordingly, because an organic layer is not arranged on the top surface IILUS of the inorganic insulating layer IIL, moisture may be prevented or reduced from penetrating toward the organic light-emitting diode OLED arranged in the display area DA.

The organic encapsulation layer 320 may be formed by coating a monomer and hardening the same. The flow of the monomer may be controlled by the dam portion DP. That is, the end of the organic encapsulation layer 320 may be arranged on one side of the dam portion DP.

Figure 8:
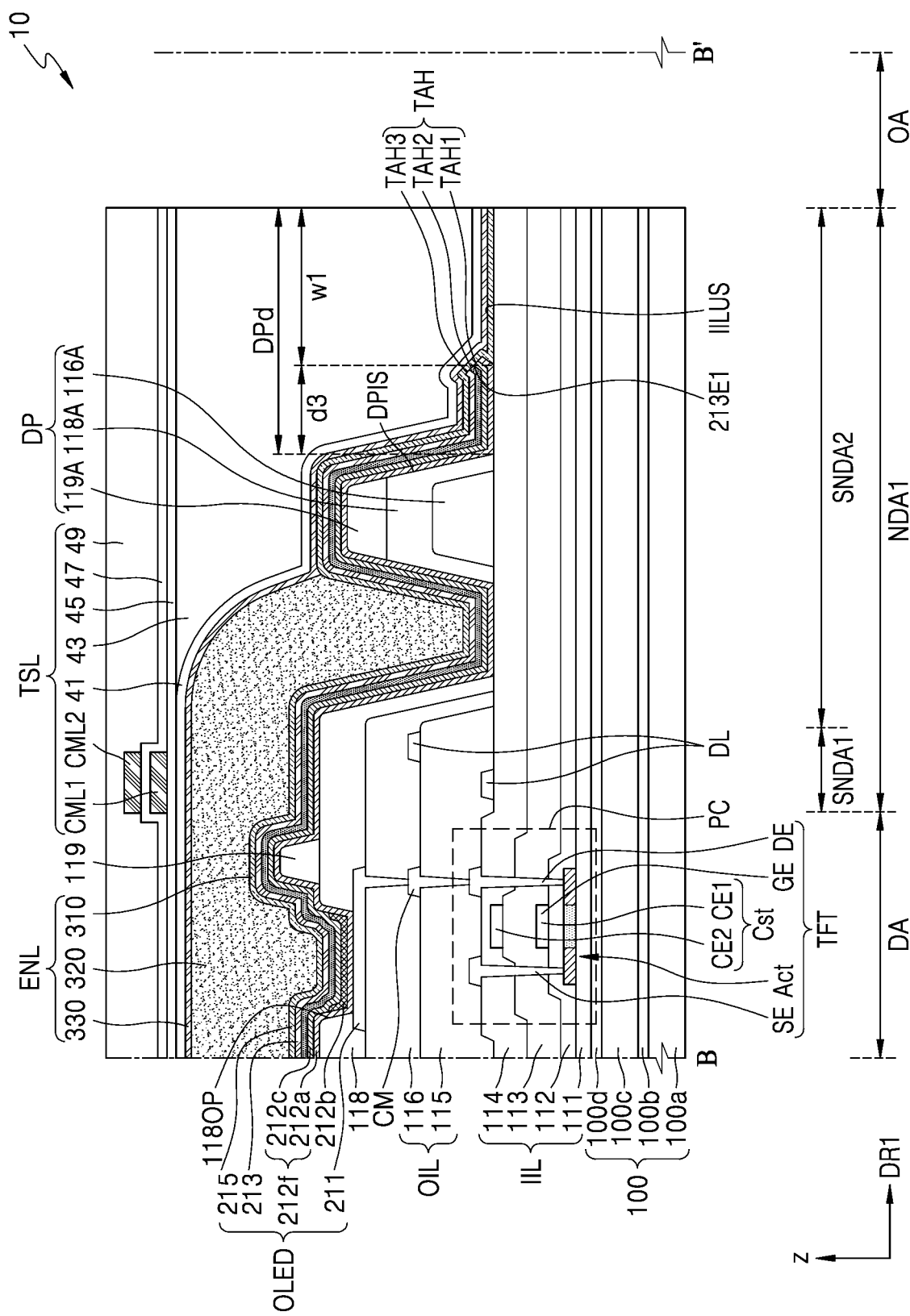
FIG. 8 is a cross-sectional view of a display panel, taken along the line B-B' of FIG. 6A according to some embodiments.

FIG. 8 is a cross-sectional view of the display panel 10, taken along the line B-B' of FIG. 6A according to some embodiments. In FIG. 8, because the same reference numerals as those of FIG. 7 denote the same members, repeated descriptions thereof are omitted.

Referring to FIG. 8, the display panel 10 may include the substrate 100, the inorganic insulating layer IIL, the organic insulating layer OIL, the pixel circuit PC, the data line DL, the connection electrode CM, the organic light-emitting diode OLED, the pixel-defining layer 118, the spacer 119, the encapsulation layer ENL, and the touch sensor layer TSL.

The touch sensor layer TSL may be arranged on the encapsulation layer ENL. The touch sensor layer TSL may include a first insulating layer 41, a second insulating layer 43, a third insulating layer 45, a first conductive layer CML1, a fourth insulating layer 47, a second conductive layer CML2, and a fifth insulating layer 49.

The first insulating layer 41 may be arranged on the second inorganic encapsulation layer 330. According to some embodiments, the first insulating layer 41 may be arranged along the shape of the second inorganic encapsulation layer 330. According to some embodiments, the first insulating layer 41 may be omitted.

The second insulating layer 43 may be arranged on the first insulating layer 41. The second insulating layer 43 may be arranged in the second sub-non display area SNDA2. The top surface of the second insulating layer 43 may be flat. The second insulating layer 43 may have a closed shape (e.g., a doughnut shape) surrounding the opening area OA. One side of the second insulating layer 43 may face the opening area OA, and another side of the second insulating layer 43 may face the display area DA. According to some embodiments, a portion of the second insulating layer 43 may overlap a portion of the organic encapsulation layer 320 while covering the edge of the organic encapsulation layer 320.

The third insulating layer 45 may be arranged on the first insulating layer 41 and the second insulating layer 43. The third insulating layer 45 may be arranged on the top surface of the second insulating layer 43 that is flat.

The first insulating layer 41 and the third insulating layer 45 may include a single layer or a multi-layer including an inorganic material such as silicon oxide ($SiO_x$), silicon nitride ($SiN_x$), and/or silicon oxynitride (SiON).

The second insulating layer 43 may include an organic insulating material. As an example, the second insulating layer 43 may include a polymer-based material. The polymer-based material may be transparent. As an example, the second insulating layer 43 may include a silicon-based resin, an acryl-based resin, an epoxy-based resin, polyimide, and polyethylene.

The first conductive layer CML1 and the second conductive layer CML2 may include a conductive material, for example, each metal. As an example, the first conductive layer CML1 and the second conductive layer CML2 may include molybdenum (Mo), aluminum (Al), copper (Cu), and titanium (Ti) and include a single layer or a multi-layer including the above materials. According to some embodiments, the first conductive layer CML1 and the second conductive layer CML2 may have a structure of Ti/Al/Ti that are sequentially stacked.

The first conductive layer CML1 and/or the second conductive layer CML2 may include a plurality of touch electrodes configured to sensing a touch input. According to some embodiments, the touch sensor layer TSL may include touch electrodes extending in the x-direction (see FIG. 3) in a plan view, and touch electrodes extending in the y-direction (see FIG. 3). The touch electrodes may sense an input through a mutual capacitive method and be provided to the first conductive layer CML1 and/or the second conductive layer CML2. According to some embodiments, the touch electrode may sense an input through a self-capacitive method and be provided to the first conductive layer CML1 or the second conductive layer CML2.

The fourth insulating layer 47 may be arranged between the first conductive layer CML1 and the second conductive layer CML2. The fourth insulating layer 47 may include a single layer or a multi-layer including an inorganic material such as silicon oxide ($SiO_x$), silicon nitride ($SiN_x$), and/or silicon oxynitride (SiON).

Though it is shown in FIG. 8 that the touch sensor layer TSL includes the first conductive layer CML1 and the second conductive layer CML2, the touch sensor layer TSL may include one of the first conductive layer CML1 and the second conductive layer CML2 according to some embodiments.

The fifth insulating layer 49 may be arranged on the second conductive layer CML2. According to some embodiments, the top surfaced of the fifth insulating layer 49 may be flat. The fifth insulating layer 49 may include an organic insulating material. As an example, the fifth insulating layer 49 may include a polymer-based material. The polymer-based material may be transparent. As an example, the fifth insulating layer 49 may include a silicon-based resin, an acryl-based resin, an epoxy-based resin, polyimide, and polyethylene.

Hereinafter, a method of manufacturing a display apparatus is described in detail.

Figure 9A:
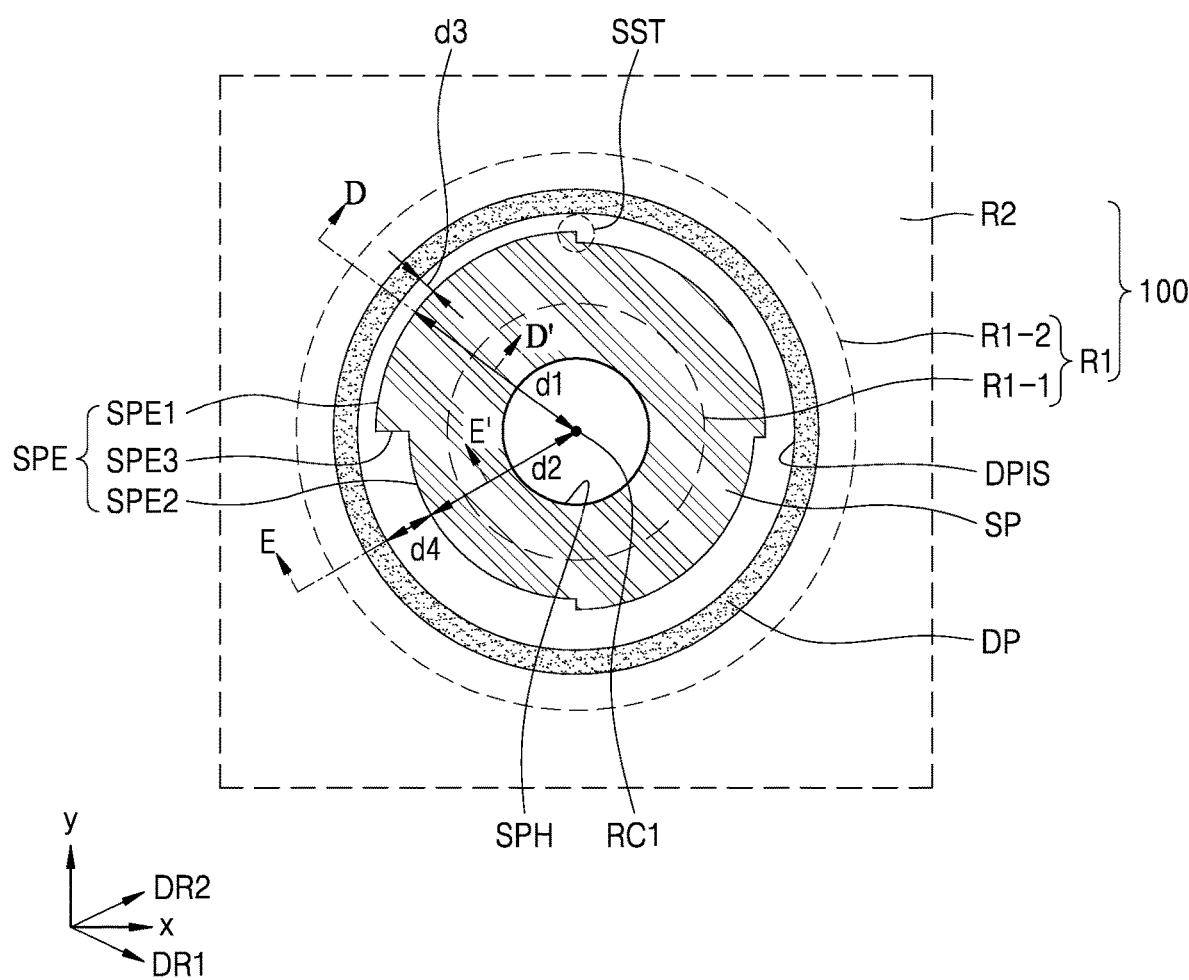
FIGS. 9A to 9C are plan views of a substrate and a sacrificial layer pattern according to some embodiments.
Figure 9B:
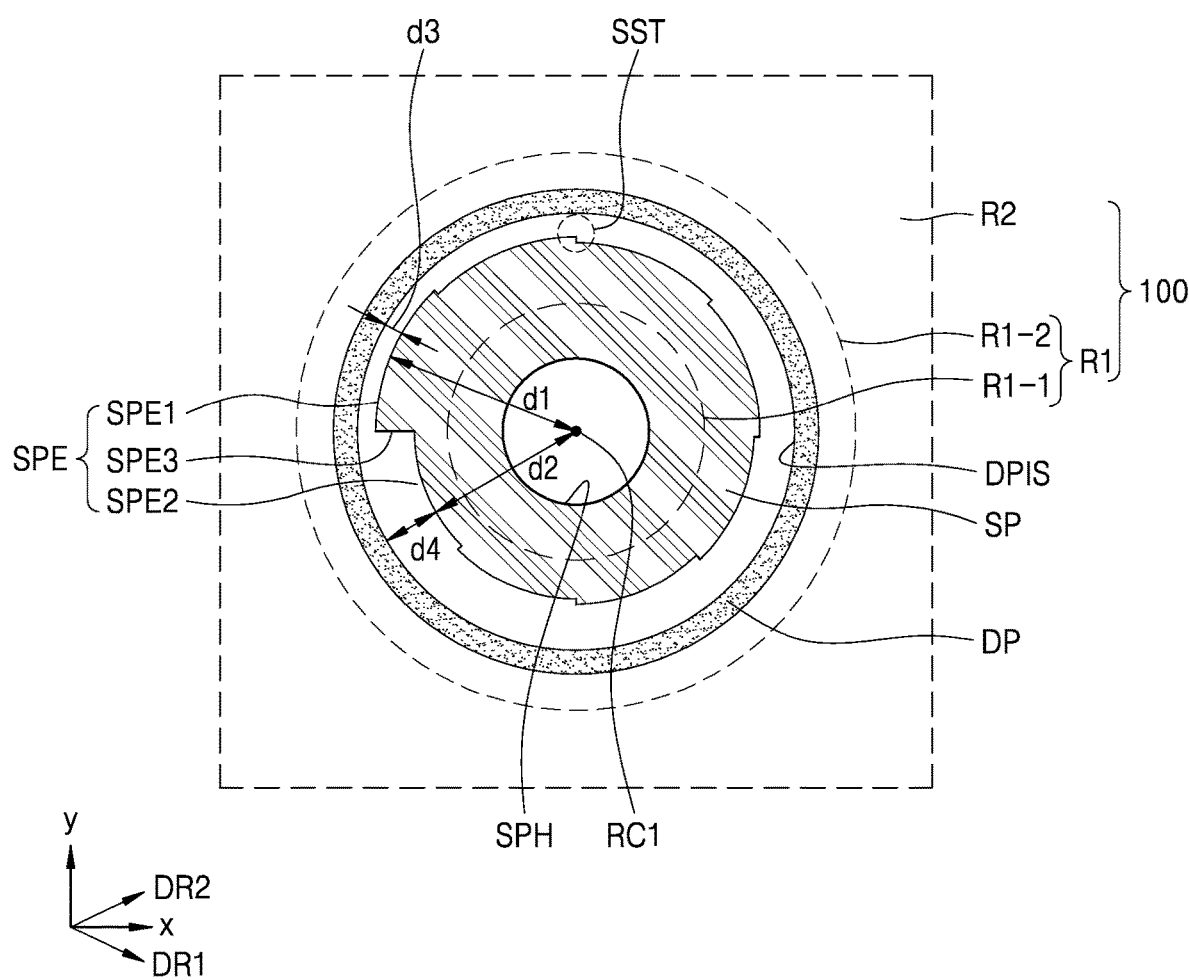
Figure 9C:
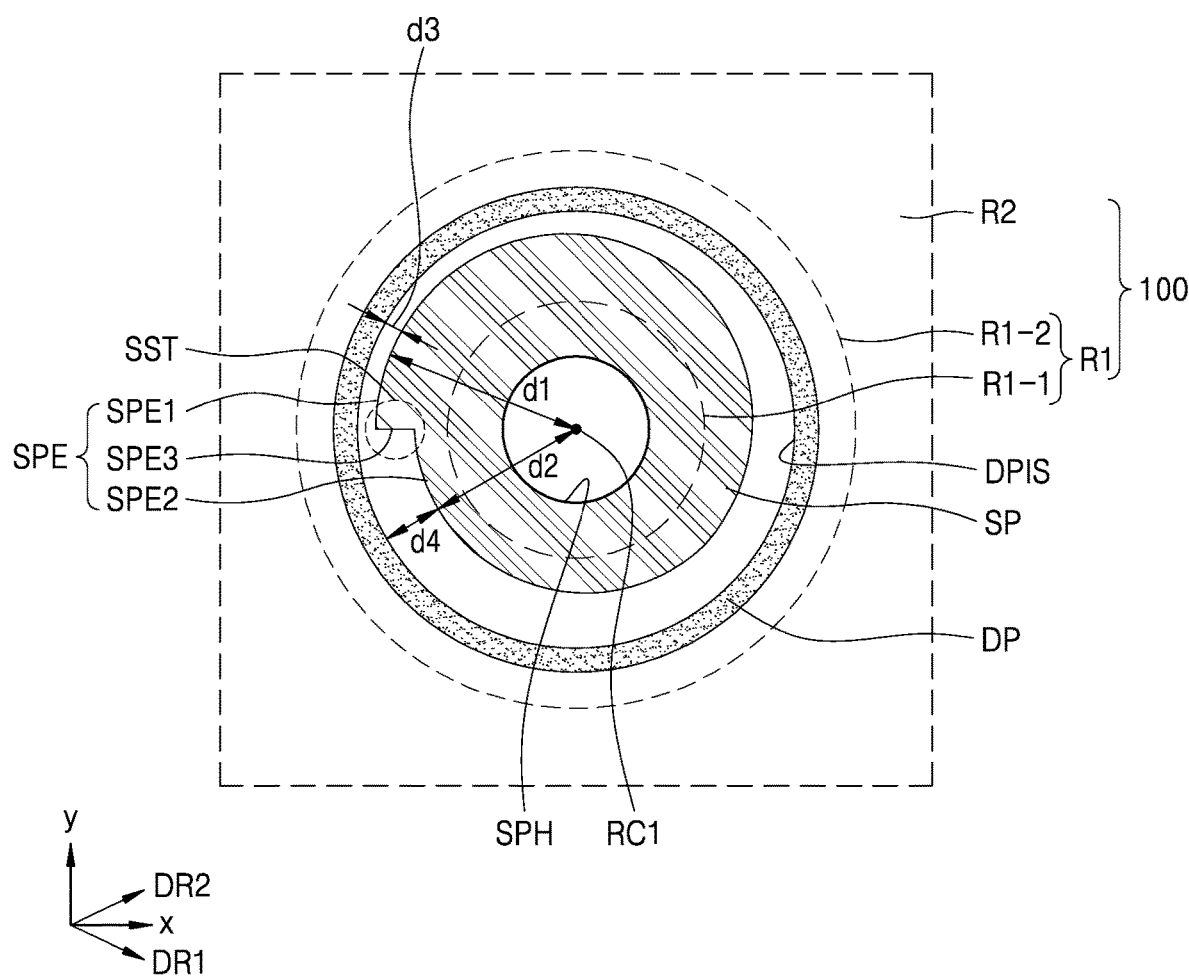

FIGS. 9A to 9C are plan views of the substrate 100 and a sacrificial layer pattern SP according to some embodiments. In FIGS. 9A to 9C, because the same reference numerals as those of FIGS. 6A to 6C denote the same members, repeated descriptions thereof are omitted.

Referring to FIGS. 9A to 9C, the substrate 100 may include a first region R1 and a second region R2. The first region R1 may include a first sub-region R1-1 and a second sub-region R1-2. The second sub-region R1-2 may surround the first sub-region R1-1. The first sub-region R1-1 may be a region including an opening area. The second sub-region R1-2 may be a region including the first non-display area.

According to some embodiments, the first region R1 may have a circular shape. When viewed from a plane (e.g., a xy-plane) or in a plan view (e.g., a xy-plane), the first region R1 may have a circular shape. In this case, the first region R1 may include a center RC1 of the first region R1. According to some embodiments, the first region R1 may have a polygonal shape. According to some embodiments, the first region R1 may have an elliptical shape or at least partially curved shape. Hereinafter, the case where the first region R1 has a circular shape is described in detail.

The second region R2 may surround the first region R1. According to some embodiments, the second region R2 may surround the first region R1 entirely. The second region R2 may include the display area.

The sacrificial layer pattern SP may be formed over the substrate 100. The sacrificial layer pattern SP may overlap the first region R1. According to some embodiments, the sacrificial layer pattern SP may include a pattern hole SPH overlapping the second sub-region R1-2. The center of the pattern hole SPH may be substantially the same as the center RC1 of the first region R1. According to some embodiments, the sacrificial layer pattern SP may not include the pattern hole SPH and be arranged in the second sub-region R1-2 entirely. Hereinafter, the case where the sacrificial layer pattern SP includes the pattern hole SPH in the second sub-region R1-2 is mainly described in detail.

The sacrificial layer pattern SP may be apart from the second region R2. That is, the sacrificial layer pattern SP may not overlap the second region R2. The sacrificial layer pattern SP may include an edge SPE facing the second region R2. The edge SPE of the sacrificial layer pattern SP may be arranged in the first sub-region R1-1 and may face the second region R2.

The size of the sacrificial layer pattern SP may be less than the size of the first region R1. The size of the sacrificial layer pattern SP may be defined as an area occupied by the sacrificial layer pattern SP. The size of the first region R1 may be defined by an area occupied by the first region R1. Accordingly, the first region R1 may overlap the sacrificial layer pattern SP entirely, and the edge SPE of the sacrificial layer pattern SP may be apart from the second region R2. In addition, a portion of the second sub-region R1-2 may not overlap the sacrificial layer pattern SP and may surround the sacrificial layer pattern SP.

The first distance d1 from the center RC1 of the first region R1 to a first edge portion SPE1 of the edge SPE of the sacrificial layer pattern SP may be different from the second distance d2 from the center RC1 of the first region R1 to a second edge portion SPE2 of the edge SPE of the sacrificial layer pattern SP. That is, when viewed from a plane (e.g., an xy-plane) or in a plan view (e.g., an xy-plane), the edge SPE of the sacrificial layer pattern SP may include a step difference SST of the sacrificial layer pattern SP. Alternatively, according to some embodiments, the edge SPE of the sacrificial layer pattern SP may be bent. In other words, the edge SPE of the sacrificial layer pattern SP may include the first edge portion SPE1, the second edge portion SPE2, a third edge portion SPE3. The first edge portion SPE1 may meet and cross the third edge portion SPE3. The second edge portion SPE2 may meet and cross the third edge portion SPE3. That is, one side of the third edge portion SPE3 may meet the first edge portion SPE1, and another side of the third edge portion SPE3 may meet the second edge portion SPE2.

The first distance d1 may be a shortest distance from the center RC1 of the first region R1 to the first edge portion SPE1 in the first direction DR1. The second distance d2 may be a shortest distance from the center RC1 of the first region R1 to the second edge portion SPE2 in the second direction DR2.

According to some embodiments, the first distance d1 may be greater than the second distance d2. In this case, the first edge portion SPE1 may be farther away from the center RC1 of the first region R1 than the second edge portion SPE2. According to some embodiments, the first distance d1 may be less than the second distance d2. In this case, the first edge portion SPE1 may be closer to the center RC1 of the first region R1 than the second edge portion SPE2.

A distance from the center RC1 of the first region R1 to the edge SPE of the sacrificial layer pattern SP may be reduced in the peripheral direction of the sacrificial layer pattern SP. As an example, a distance from the center RC1 of the first region R1 to the edge SPE of the sacrificial layer pattern SP may be reduced clockwise. According to some embodiments, a distance from the center RC1 of the first region R1 to the edge SPE of the sacrificial layer pattern SP may be reduced counterclockwise.

According to some embodiments, at least one dam portion DP may be arranged between the first sub-region R1-1 and the second region R2. As an example, one dam portion DP may be arranged in the second sub-region R1-2, or a plurality of dam portions DP may be arranged in the second sub-region R1-2. The dam portion DP may surround the first sub-region R1-1. The dam portion DP may include the inner surface DPIS of the dam portion DP facing the first sub-region R1-1.

The third distance d3 from the inner surface DPIS of the dam portion DP to the first edge portion SPE1 may be different from the fourth distance d4 from the inner surface DPIS of the dam portion DP to the second edge portion SPE2. The third distance d3 may be a distance in which the sacrificial layer pattern SP is arranged from the inner surface DPIS of the dam portion DP to the first edge portion SPE1. The fourth distance d4 may be a distance in which the sacrificial layer pattern SP is arranged from the inner surface DPIS of the dam portion DP to the second edge portion SPE2.

The sacrificial layer pattern SP may be a sacrificial layer for a laser-lift off process. According to some embodiments, the sacrificial layer pattern SP may be formed by forming a material of the sacrificial layer pattern SP on the substrate 100 entirely and then patterning the same. According to some embodiments, the sacrificial layer pattern SP may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), titanium nitride (TiN), tungsten (W), and/or copper (Cu). According to some embodiments, the sacrificial layer pattern SP may include amorphous silicon doped with dopant. Dopant added to amorphous silicon may be one of boron (B), phosphorus (P), nitrogen (N), nickel (Ni), cobalt (Co), and fluorine (F).

When viewed from a plane (e.g., a xy-plane) or in a plan view (e.g., a xy-plane), the edge SPE of the sacrificial layer pattern SP may include at least one step difference STT of the sacrificial layer pattern SP. According to some embodiments, the step difference ST of the sacrificial layer pattern SP may be defined by the third edge portion SPE3 and portions of the first edge portion SPE1 and the second edge portion SPE2 that cross the third edge portion SPE3.

Referring to FIGS. 9A and 9B, the edge portion SPE of the sacrificial layer pattern SP may include a plurality of step differences STT of the sacrificial layer pattern SP. Referring to FIG. 9A, the edge SPE of the sacrificial layer pattern SP may include four step differences STT of the sacrificial layer SP. Referring to FIG. 9B, the edge SPE of the sacrificial layer pattern SP may include eight step differences STT of the sacrificial layer pattern SP. According to some embodiments, the edge SPE of the sacrificial layer pattern SP may include various numbers of step differences STT of the sacrificial layer pattern SP. Accordingly, a distance from the center RC1 of the first region R1 to the edge SPE of the sacrificial layer pattern SP may be reduced with a constant interval in the peripheral direction of the sacrificial layer pattern SP.

Referring to FIG. 9C, a distance from the center RC1 of the first region R1 to the edge SPE of the sacrificial layer pattern SP may be continuously reduced in the peripheral direction of the sacrificial layer pattern SP. As an example, the edge SPE of the sacrificial layer pattern SP from the center RC1 of the first region R1 may be continuously reduced clockwise. In this case, the edge SPE of the sacrificial layer pattern SP may include one step difference STT of the sacrificial layer pattern SP. Though it is shown in FIG. 9C that one step difference STT of the sacrificial layer pattern SP is bent, the first edge portion 213E and the third edge portion 213E3 may be connected in a curved shape according to some embodiments. In addition, the second edge portion 213E2 and the third edge portion 213E3 may be connected in a curved shape.

Hereinafter, a method of manufacturing a display apparatus is described in detail based on the shape of the sacrificial layer pattern SP described with reference to FIG. 9A.

Figure 10B:
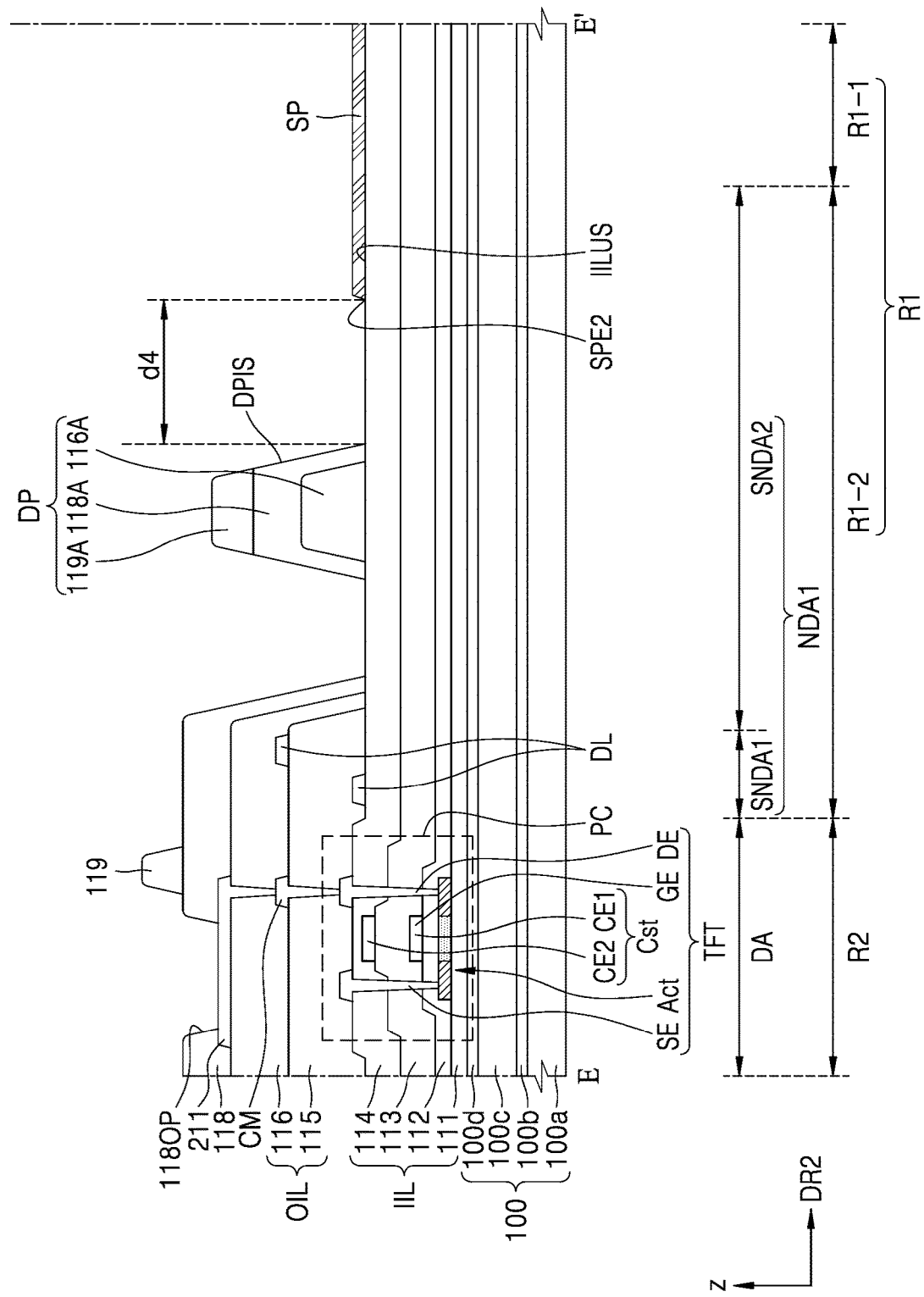
FIG. 10B is a cross-sectional view of the substrate and the sacrificial layer pattern, taken along the line E-E' of FIG. 9A according to some embodiments.

FIG. 10A is a cross-sectional view of the substrate 100 and the sacrificial layer pattern SP, taken along the line D-D' of FIG. 9A according to some embodiments. FIG. 10B is a cross-sectional view of the substrate 100 and the sacrificial layer pattern SP, taken along the line E-E' of FIG. 9A according to some embodiments. In FIGS. 10A to 10B, because the same reference numerals as those of FIGS. 7A and 7B denote the same members, repeated descriptions thereof are omitted.

Referring to FIGS. 10A and 10B, the inorganic insulating layer IIL may be formed on the substrate 100. According to some embodiments, the substrate 100 may include the first region R1 and the second region R2. The first region R1 may include the first sub-region R1-1 and the second sub-region R1-2. According to some embodiments, the first sub-region R1-1 may be a region which will be the opening area. The second sub-region R1-2 may be a region which will be the first non-display area NDA1. The second region R2 may be a region which will be the display area DA.

According to some embodiments, the substrate 100 may include the first base layer 100a, the first barrier layer 100b, the second base layer 100c, and the second barrier layer 100d. According to some embodiments, the first base layer 100a, the first barrier layer 100b, the second base layer 100c, and the second barrier layer 100d may be sequentially stacked.

The inorganic insulating layer IIL may be formed on the substrate 100. The inorganic insulating layer IIL may include the buffer layer 111, the first gate insulating layer 112, the second gate insulating layer 113, and the interlayer insulating layer 114. The inorganic insulating layer IIL may be arranged in the first region R1 and the second region R2.

The pixel circuit PC may be formed in the first region R1. The pixel circuit PC may include a thin-film transistor TFT and a storage capacitor Cst. The thin-film transistor TFT may include the semiconductor layer Act, the gate electrode GE, the source electrode SE, and the drain electrode DE. The storage capacitor Cst may include the bottom electrode CE1 and the top electrode CE2.

Signal lines, for example, the data line DL may be formed in the first sub-non display area SNDA1. According to some embodiments, the data line DL may be arranged between the inorganic insulating layer IIL and the first organic insulating layer 115 and/or between the first organic insulating layer 115 and the second organic insulating layer 116.

The organic insulating layer OIL may be formed on the inorganic insulating layer IIL. The organic insulating layer OIL may include the first organic insulating layer 115 and the second organic insulating layer 116. According to some embodiments, the connection electrode CM may be formed between the first organic insulating layer 115 and the second organic insulating layer 116.

The first electrode 211 may be formed in the second region R2. According to some embodiments, the first electrode 211 may be formed on the organic insulating layer OIL. The first electrode 211 may be electrically connected to the connection electrode CM through a contact hole of the second organic insulating layer 116.

The pixel-defining layer 118 including the opening 118OP may be formed on the first electrode 211, the opening 118OP exposing the central portion of the first electrode 211. The spacer 119 may be formed on the pixel-defining layer 118.

The dam portion DP may be formed in the second sub-region R1-2. According to some embodiments, the dam portion DP may protrude from the top surface IILUS of the inorganic insulating layer K. As an example, the dam portion DP may protrude from the top surface of the interlayer insulating layer 114. As another example, the dam portion DP may protrude the top surface of the buffer layer 111. In this case, the first gate insulating layer 112, the second gate insulating layer 113, and the interlayer insulating layer 114 may not be arranged in the second sub-non display area SNDA2. As another example, the dam portion DP may protrude from the top surface of one of the first gate insulating layer 112, the second gate insulating layer 113, and the interlayer insulating layer 114.

According to some embodiments, the dam portion DP may include the organic pattern layer 116A, the first top organic pattern layer 118A, and the second top organic pattern layer 119A. The organic pattern layer 116A may be simultaneously formed with one of the first organic insulating layer 115 and the second organic insulating layer 116. In this case, the organic pattern layer 116A may include the same material as one of the first organic insulating layer 115 and the second organic insulating layer 116. The first top organic pattern layer 118A and the second top organic pattern layer 119A may be formed on the organic pattern layer 116A. According to some embodiments, the first top organic pattern layer 118A may be simultaneously formed with the pixel-defining layer 118. In this case, the first top organic pattern layer 118A may include the same material as that of the pixel-defining layer 118. According to some embodiments, the second top organic pattern layer 119A may be simultaneously formed with the spacer 119. In this case, the second top organic pattern layer 119A may include the same material as that of the spacer 119.

The sacrificial layer pattern SP may be formed on the substrate 100. The sacrificial layer pattern SP may overlap the first region R1. The sacrificial layer pattern SP may overlap the first sub-region R1-1 and the second sub-region R1-2. The sacrificial layer pattern SP may be apart from the second region R2. That is, the sacrificial layer pattern SP may not overlap the second region R2.

According to some embodiments, the sacrificial layer pattern SP may be formed on the top surface IILUS of the inorganic insulating layer IIL. According to some embodiments, the sacrificial layer pattern SP may be formed on the top surface of one of the buffer layer 111, the first gate insulating layer 112, and the second gate insulating layer 113. As another example, in the case where the first gate insulating layer 112, the second gate insulating layer 113, and the interlayer insulating layer 114 are not arranged in the first sub-region R1-1 and the second sub-non display area SNDA2, the sacrificial layer pattern SP may be formed on the top surface of the buffer layer 111. Hereinafter, the case where the sacrificial layer pattern SP is formed on the top surface IILUS of the inorganic insulating layer IIL is mainly described in detail.

The third distance d3 from the inner surface DPIS of the dam portion DP to the first edge portion SPE1 may be different from the fourth distance d4 from the inner surface DPIS of the dam portion DP to the second edge portion SPE2. The third distance d3 may be a shortest distance from the end of the inner surface DPIS of the dam portion DP to the first edge portion SPE1 of the sacrificial layer pattern SP. The fourth distance d4 may be a shortest distance from the end of the inner surface DPIS of the dam portion DP to the second edge portion SPE2 of the sacrificial layer pattern SP.

According to some embodiments, the sacrificial layer pattern SP may include the same material as one of the semiconductor layer Act, the gate electrode GE, the source electrode SE, the drain electrode DE, the top electrode CE2, the connection electrode CM, and the first electrode 211. According to some embodiments, sacrificial layer pattern SP may be simultaneously formed with one of the semiconductor layer Act, the gate electrode GE, the source electrode SE, the drain electrode DE, the top electrode CE2, the connection electrode CM, and the first electrode 211. Accordingly, a mask process may not be added.

Figure 11A:
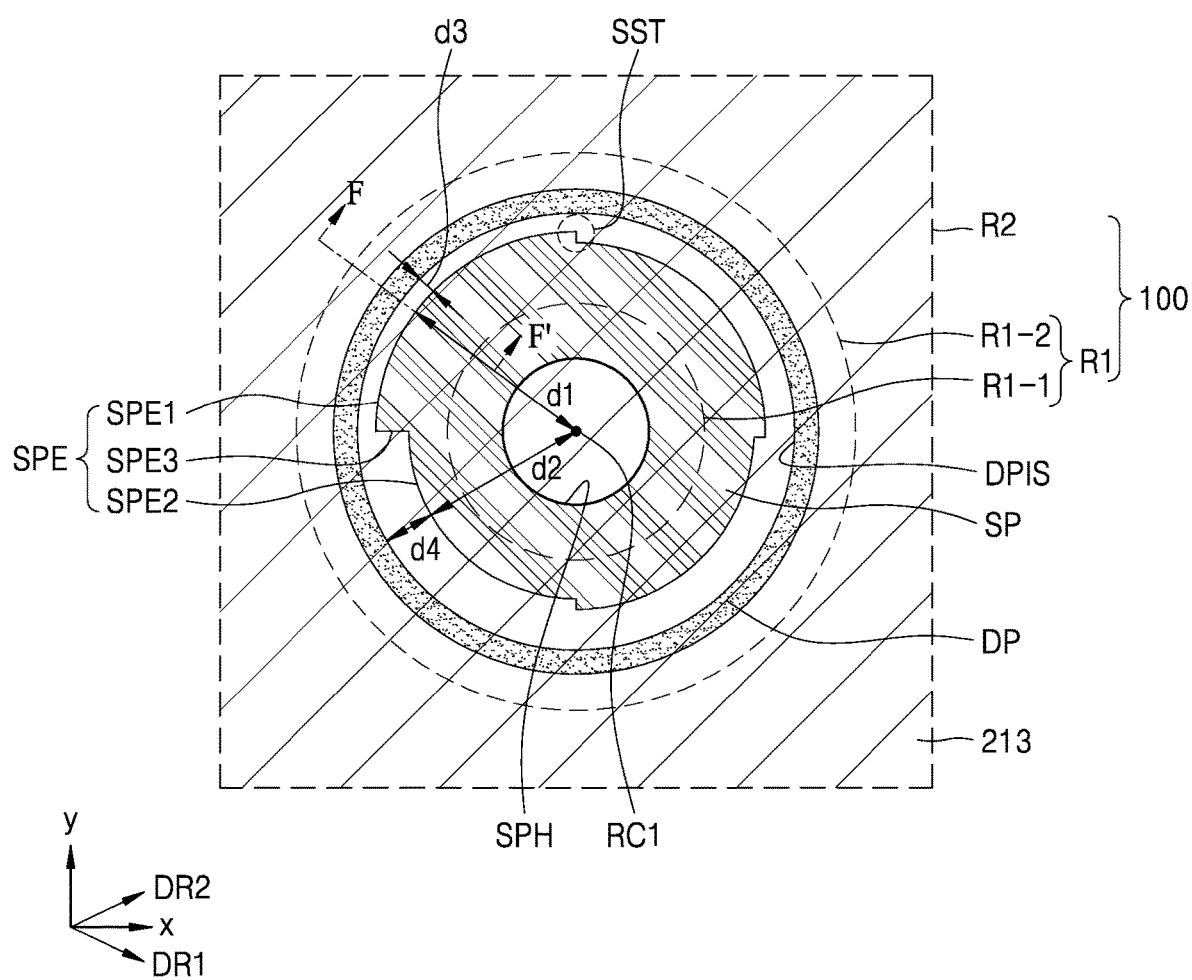
FIG. 11A is a plan view showing a method of manufacturing a display apparatus according to some embodiments.
Figure 11B:
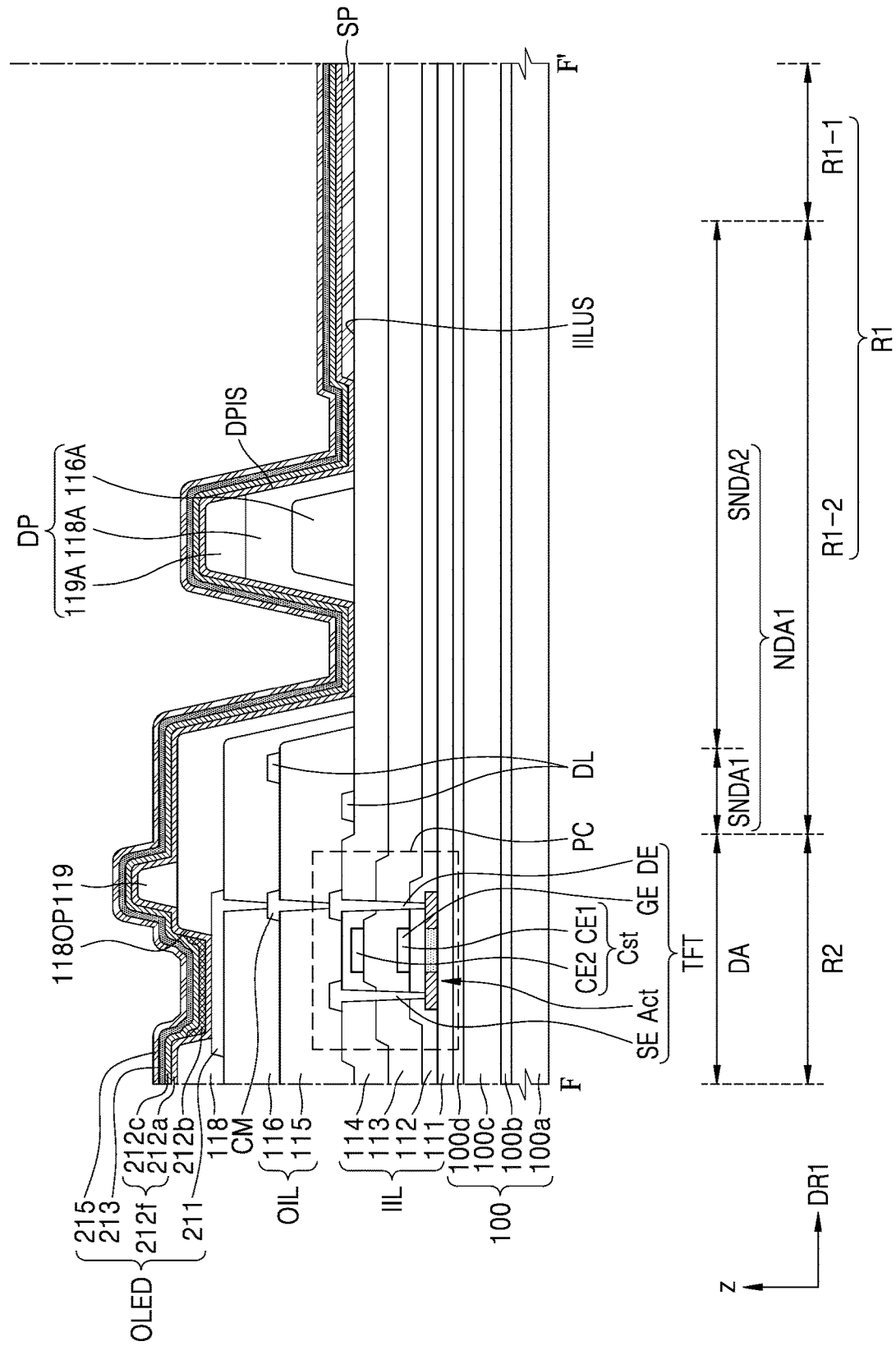
FIG. 11B is a cross-sectional view of a substrate and a sacrificial layer pattern, taken along the line F-F' of FIG. 11A according to some embodiments.
Figure 12A:
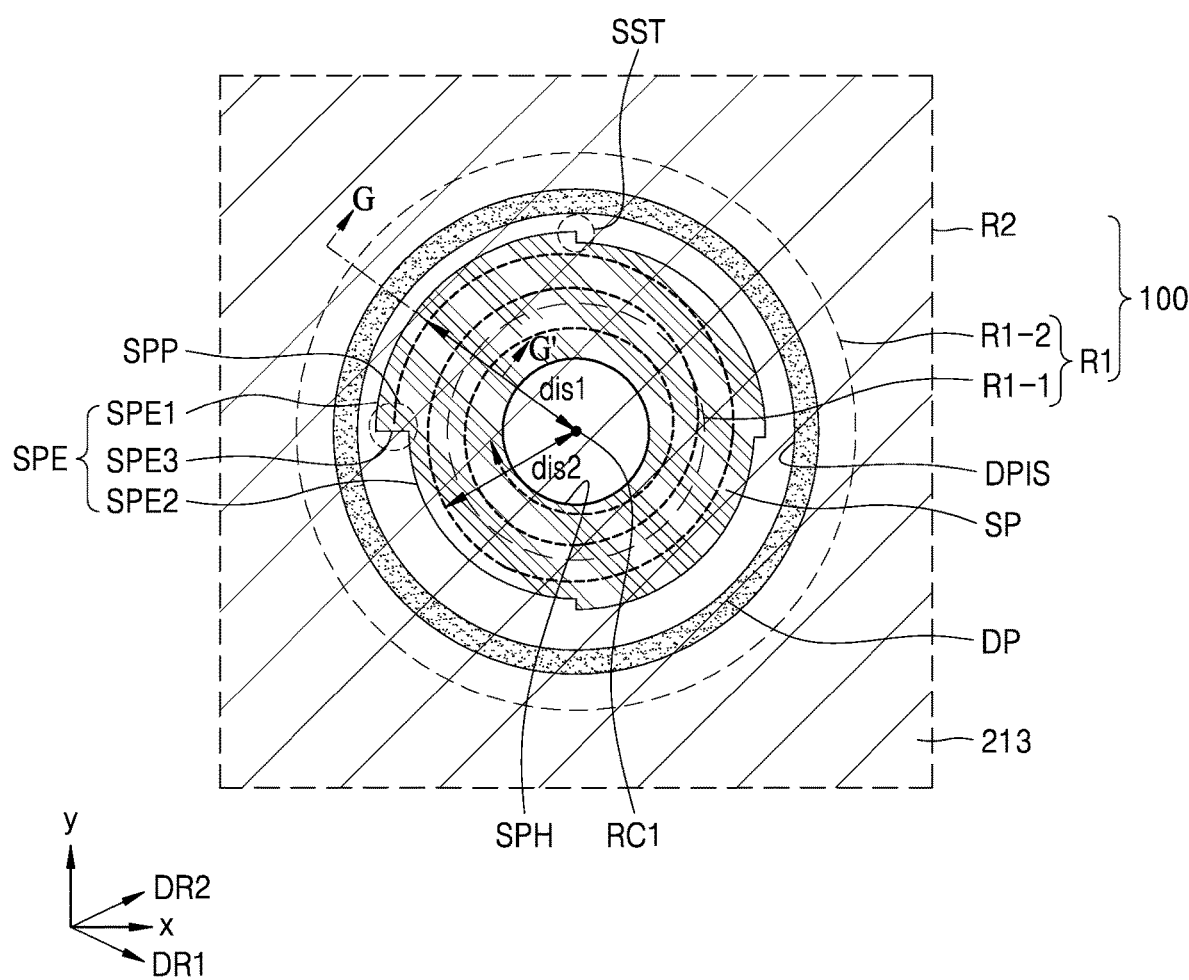
FIG. 12A is a plan view showing a method of manufacturing a display apparatus according to some embodiments.
Figure 12B:
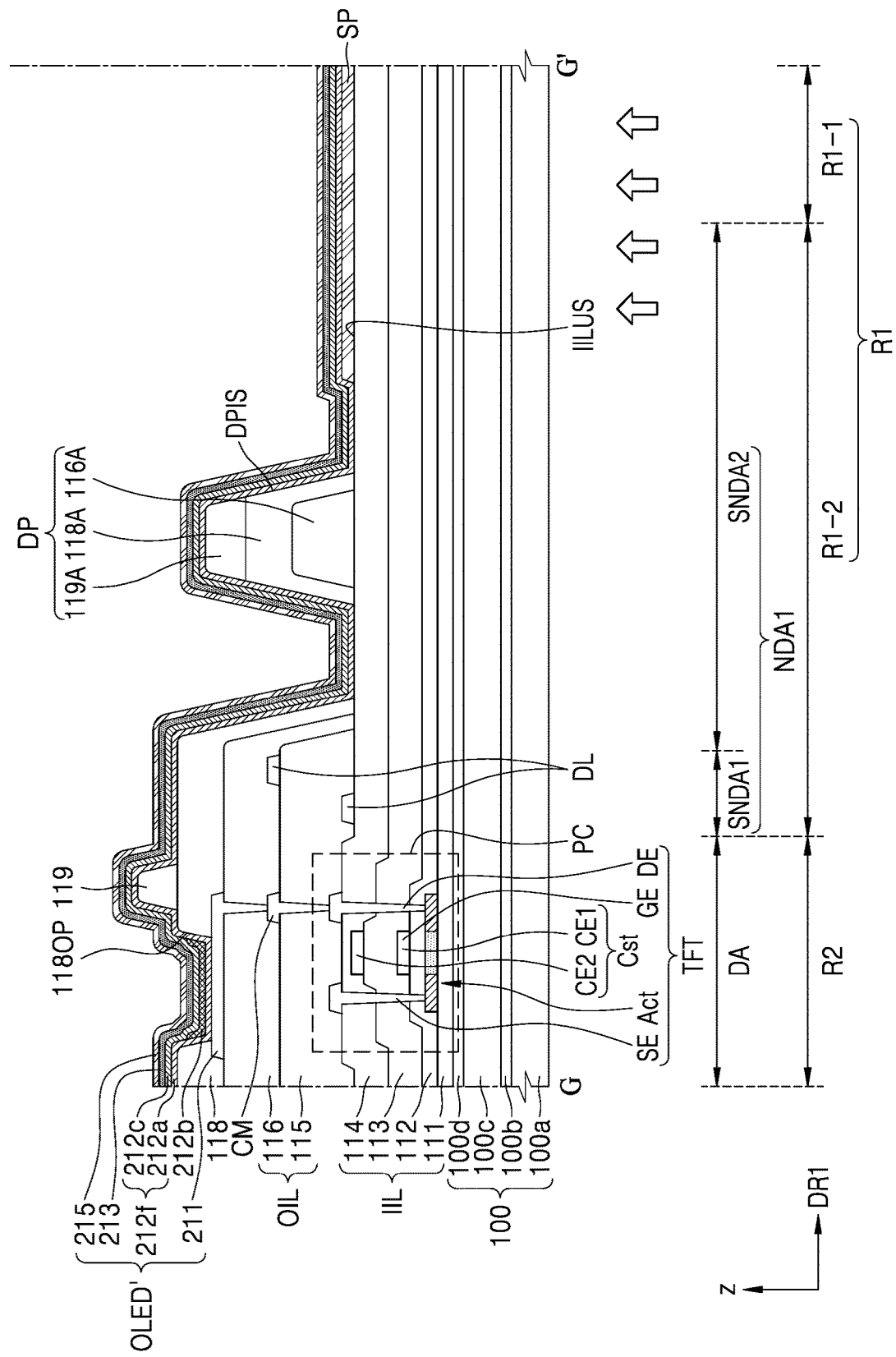
FIG. 12B is a cross-sectional view of a substrate and a sacrificial layer pattern, taken along the line G-G' of FIG. 12A according to some embodiments.
Figure 13A:
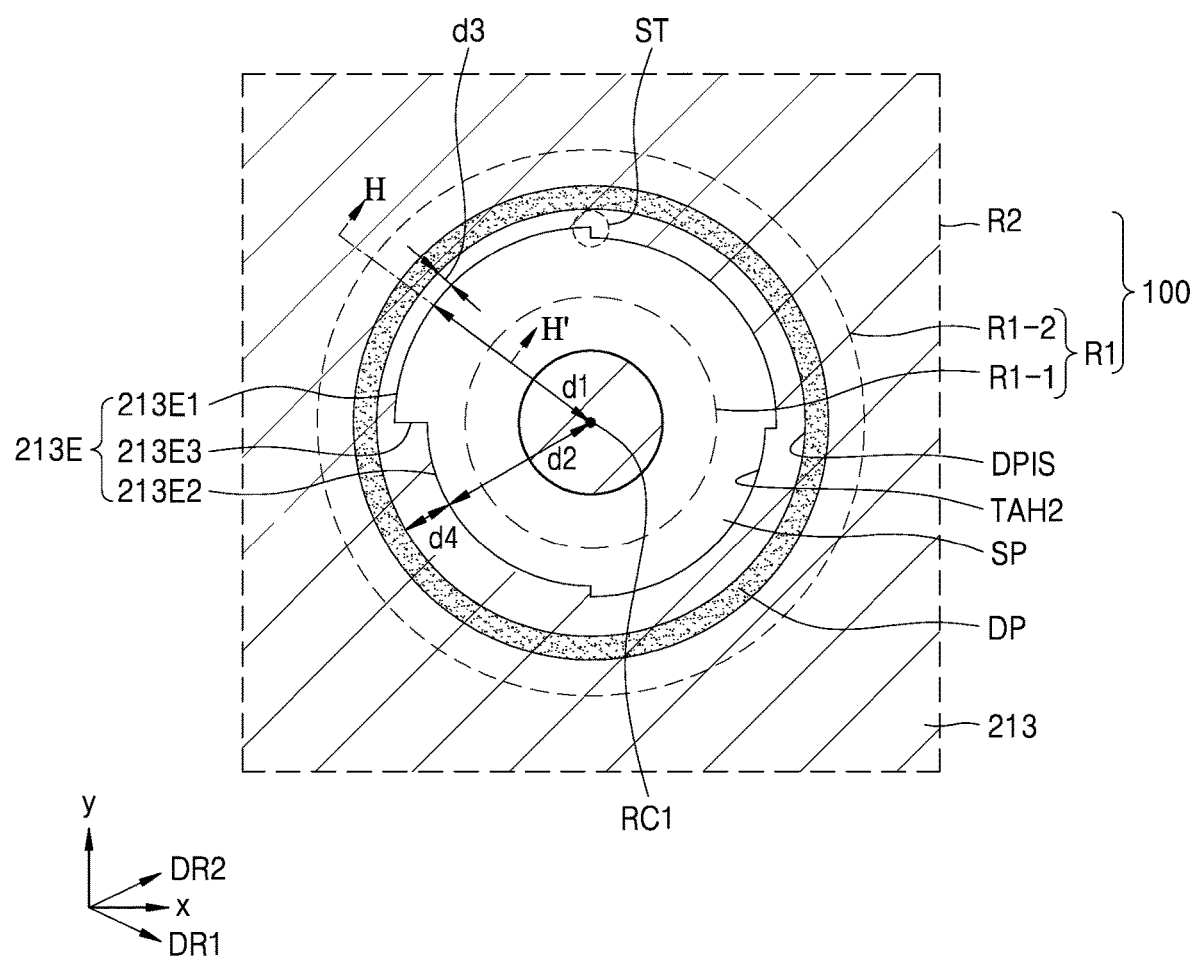
FIG. 13A is a plan view showing a method of manufacturing a display apparatus according to some embodiments.
Figure 13B:
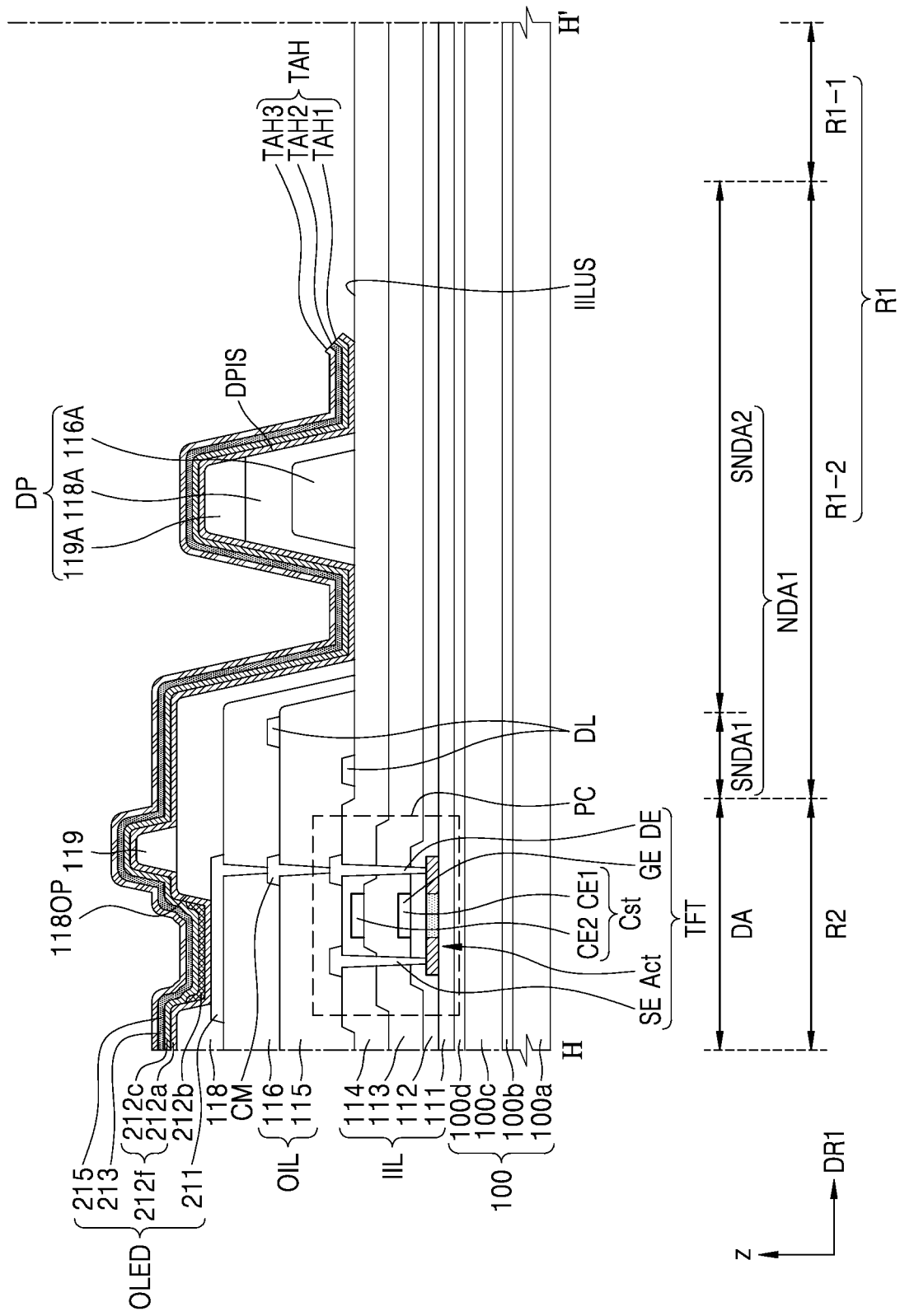
FIG. 13B is a cross-sectional view of a substrate and a sacrificial layer pattern, taken along the line G-G' of FIG. 13A according to some embodiments.
Figure 14:
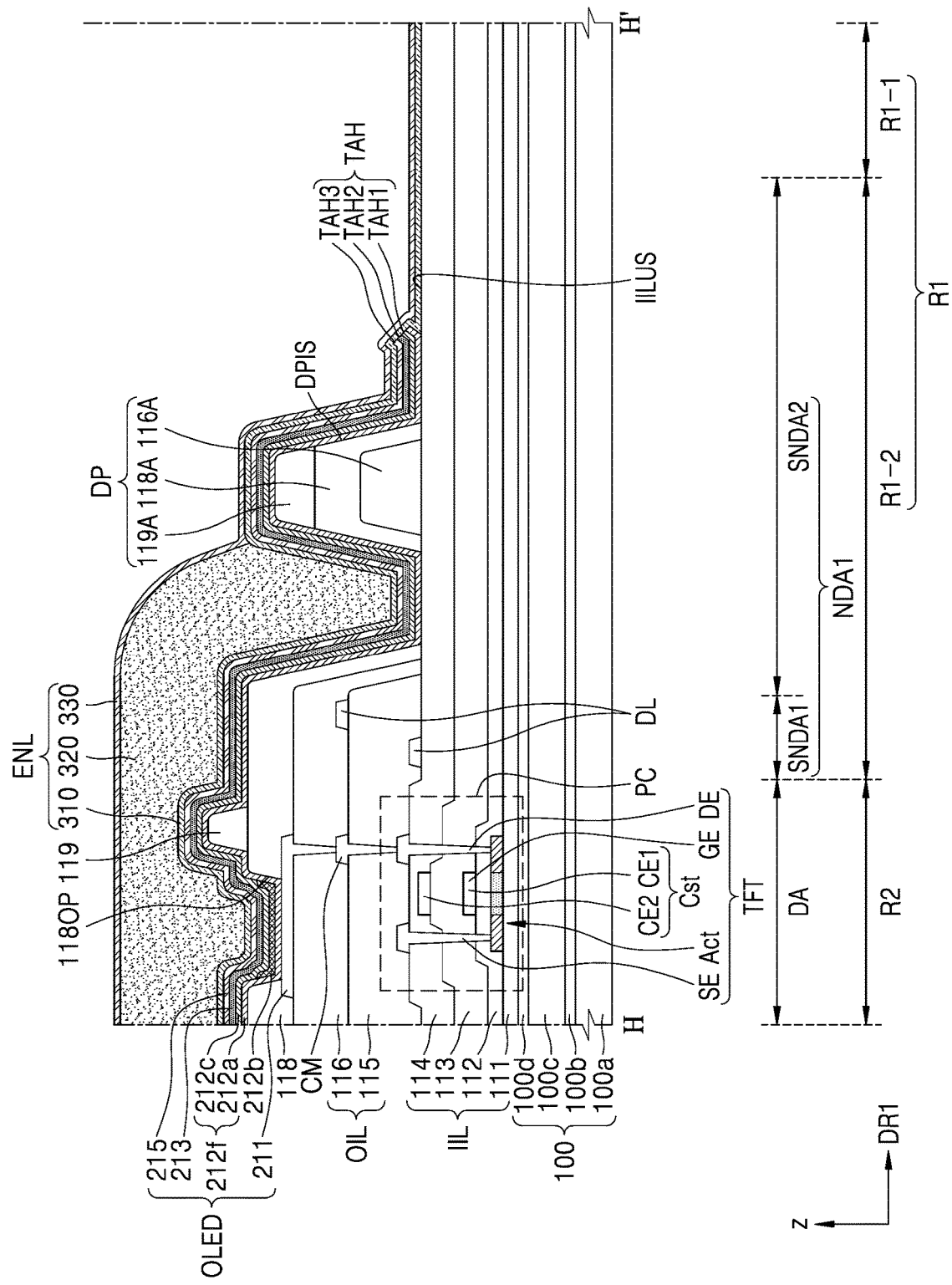
FIG. 14 is a cross-sectional view of a substrate and a sacrificial layer pattern, taken along the line G-G' of FIG. 13A according to some embodiments.
Figure 15A:
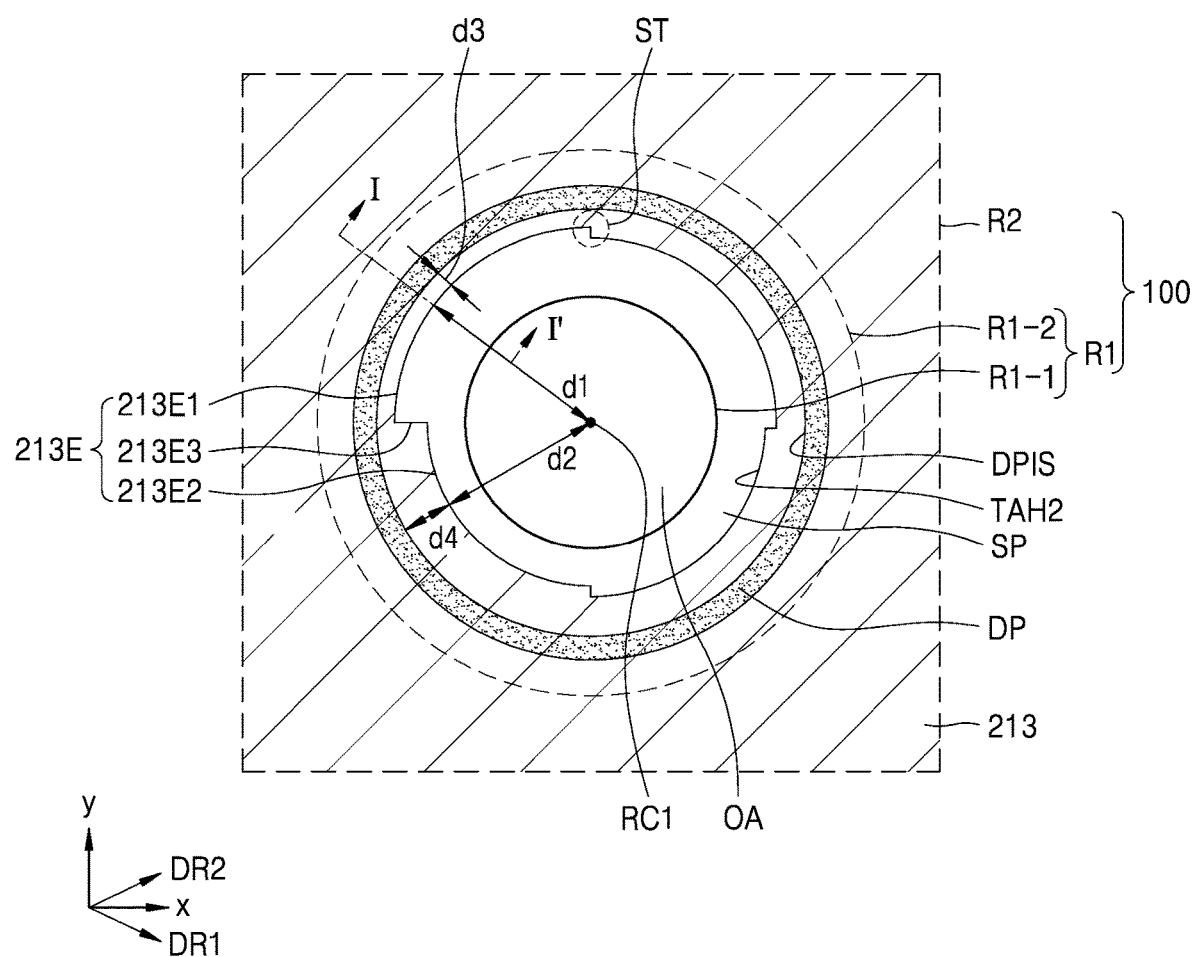
FIG. 15A is a plan view showing a method of manufacturing a display apparatus according to some embodiments.
Figure 15B:
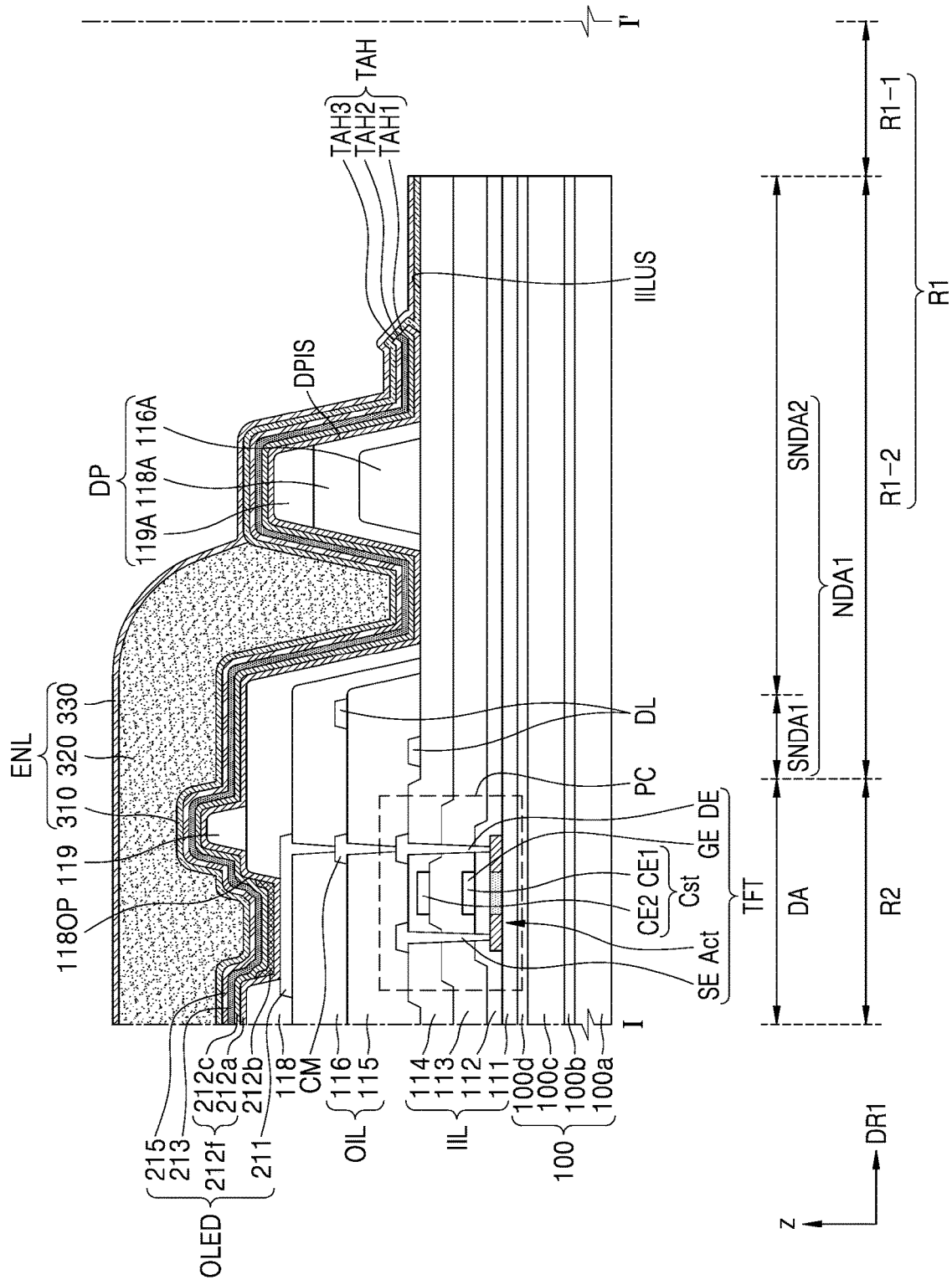
FIG. 15B is a cross-sectional view of a substrate and a sacrificial layer pattern, taken along the line I-I' of FIG. 15A according to some embodiments.

FIG. 11A is a plan view showing a method of manufacturing a display apparatus according to some embodiments. FIG. 11B is a cross-sectional view of the substrate 100 and the sacrificial layer pattern SP, taken along the line F-F' of FIG. 11A according to some embodiments. FIG. 12A is a plan view showing a method of manufacturing a display apparatus according to some embodiments. FIG. 12B is a cross-sectional view of the substrate 100 and the sacrificial layer pattern SP, taken along the line G-G' of FIG. 12A according to some embodiments. FIG. 13A is a plan view showing a method of manufacturing a display apparatus according to some embodiments. FIG. 13B is a cross-sectional view of the substrate 100 and the sacrificial layer pattern SP, taken along the line G-G' of FIG. 13A according to some embodiments. FIG. 14 is a cross-sectional view of the substrate 100 and the sacrificial layer pattern SP, taken along the line G-G' of FIG. 13A according to some embodiments. FIG. 15A is a plan view showing a method of manufacturing a display apparatus according to some embodiments. FIG. 15B is a cross-sectional view of the substrate 100 and the sacrificial layer pattern SP, taken along the line I-I' of FIG. 15A according to some embodiments.

Referring to FIGS. 11A and 11B, the functional layer 212*f* and the second electrode 213 may be formed on the second region R2 and the sacrificial layer pattern SP, the functional layer 212*f* including at least one of the first functional layer 212*a* or the second functional layer 212*c*. According to some embodiments, the functional layer 212*f* and the second electrode 213 may be formed on the first electrode 211 and the sacrificial layer pattern SP. According to some embodiments, the first functional layer 212*a*, the emission layer 212*b*, the second functional layer 212*c*, the second electrode 213, and the capping layer 215 may be sequentially formed. In this case, the first functional layer 212*a*, the second functional layer 212*c*, the second electrode 213, and the capping layer 215 may be formed on the substrate 100 entirely. The emission layer 212*b* may be formed inside the opening 1180P of the pixel-defining layer 118.

Referring to FIGS. 12A and 12B, a laser may be irradiated to the sacrificial layer pattern SP. The laser may progress in the thickness direction of the substrate 100 from the bottom surface of the substrate 100 and be irradiated to the bottom surface of the sacrificial layer pattern SP. The laser light may have an infrared wavelength. In the case where the laser is an infrared ray, because transmittance of the substrate 100 and the inorganic insulating layer IIL is 80% to 90% or more, the laser may efficiently reach the sacrificial layer pattern SP.

The laser may be irradiated along a spiral irradiation path. Though it is shown in FIG. 12A that the laser is irradiated clockwise, the laser may be irradiated according to some embodiments.

According to some embodiments, a distance between the center RC1 of the first region R1 and an irradiation path may be reduced in the peripheral direction of the sacrificial layer pattern SP. As an example, when the laser is irradiated to a region corresponding to the first edge portion SPE1, a distance between the center RC1 of the first region R1 and an irradiation path may be apart by a first central distance dis1. When the laser is irradiated to a region corresponding to the second edge portion SPE2, a distance between the center RC1 of the first region R1 and an irradiation path may be apart by a second central distance dis2. In this case, the first central distance dis1 may be different from the second central distance dis2. As an example, the first central distance dis1 may be greater than the second central distance dis2.

According to some embodiments, the distance between the center RC1 of the first region R1 and an irradiation path may be continuously reduced in the peripheral direction of the sacrificial layer pattern SP. According to some embodiments, the distance between the center RC1 of the first region R1 and an irradiation path may be reduced with a constant interval in the peripheral direction of the sacrificial layer pattern SP. Accordingly, the laser may be prevented or reduced from being irradiated to the same point of the sacrificial layer pattern SP.

According to some embodiments, the laser may be irradiated to a portion SPP of the sacrificial layer pattern SP arranged between the first edge portion SPE1 and the third edge portion SPE3, the portion SPP being one of a start point and an end point. According to some embodiments, the laser may be irradiated to the portion SPP of the sacrificial layer pattern SP as a start point. That is, the laser may be irradiated starting from a portion of the sacrificial layer pattern SP where the step difference SST is provided. According to some embodiments, the laser may be irradiated to the portion SPP of the sacrificial layer pattern SP as an end point. That is, the laser may be irradiated up to a portion of the sacrificial layer pattern SP where the step difference SP is provided. Accordingly, due to the shape of the sacrificial layer pattern SP including the step difference STT, even though the laser is irradiated along a spiral irradiation path, a non-processed region may be reduced.

Because the sacrificial layer pattern SP includes opaque metal, the sacrificial layer pattern SP may absorb the laser. According to some embodiments, at least a portion of the sacrificial layer pattern SP may thermally expand and be lift-off from the inorganic insulating layer IIL. In addition, the first functional layer 212*a*, the second functional layer 212*c*, the second electrode 213, and the capping layer 215 may be lift-off together with the sacrificial layer pattern SP.

Referring to FIGS. 13A and 13B, the transmission hole TAH may be formed. According to some embodiments, the functional layer hole TAH1 may be formed by removing the functional layer 212*f* overlapping the sacrificial layer pattern SP. In addition, the second electrode hole TAH2 may be formed by removing the second electrode 213 overlapping the sacrificial layer pattern SP. In addition, the capping layer hole TAH3 may be formed by removing the capping layer 215 overlapping the sacrificial layer pattern SP. The functional layer hole TAH1, the second electrode hole TAH2, and the capping layer hole TAH3 may each expose the top surface IILUS of the inorganic insulating layer IIL. Because the functional layer hole TAH1 and the capping layer hole TAH3 are the same as or similar to the second electrode hole TAH2, the shape of the hole is described in detail based on the second electrode hole TAH2.

The edge 213E of the second electrode 213 may define the second electrode hole TAH2. The edge 213E of the second electrode 213 may face and surround the first sub-region R1-1.

The edge 213E of the second electrode 213 may be apart from the first sub-region R1-1. The edge 213E of the second electrode 213 may overlap the second sub-region R1-2 and be apart from the first sub-region R1-1. The edge 213E of the second electrode 213 may be the end of the second electrode 213 facing the first sub-region R1-1.

The first distance d1 from the center RC1 of the first region R1 to the first portion 213E1 of the edge 213E of the second electrode 213 may be different from the second distance d2 from the center RC1 of the first region R1 to the second portion 213E2 of the edge 213E of the second electrode 213. When viewed from a plane (e.g., an xy-plane) or in a plan view (e.g., an xy-plane), the edge 213E of the second electrode 213 may include the step difference ST. Alternatively, according to some embodiments, the edge 213E of the second electrode 213 may be bent. The shape of the edge 213E of the second electrode 213 may be due to the shape of the sacrificial layer pattern SP.

According to some embodiments, the first distance d1 may be greater than the second distance d2. In this case, the first portion 213E1 may be farther away from the center RC1 of the first region R1 than the second portion 213E2. According to some embodiments, the first distance d1 may be less than the second distance d2. In this case, the first portion 213E1 may be closer to the center RC1 of the first region R1 than the second portion 213E2.

According to some embodiments, a distance between the center RC1 of the first region R1 and the edge 213E of the second electrode 213 may be reduced in the peripheral direction of the second electrode hole TAH2.

The third distance d3 from the inner surface DPIS of the dam portion DP to the first portion 213E1 may be different from the fourth distance d4 from the inner surface DPIS of the dam portion DP to the second portion 213E2. In this case, a sum of the first distance d1 and the third distance d3 may be substantially the same as a sum of the second distance d2 and the fourth distance d4.

Referring to FIG. 14, the encapsulation layer ENL may be formed. The encapsulation layer ENL may be formed on the second electrode 213. The encapsulation layer ENL may be formed in the first region R1 and the second region R2. The encapsulation layer ENL may include the first inorganic encapsulation layer 310, the organic encapsulation layer 320, and the second inorganic encapsulation layer 330. According to some embodiments, the touch sensor layer and/or the optical functional layer may be further formed.

The first inorganic encapsulation layer 310 and the second inorganic encapsulation layer 330 may extend from the display area DA to the transmission hole TAH to overlap the transmission hole TAH. According to some embodiments, the first inorganic encapsulation layer 310 and the second inorganic encapsulation layer 330 may overlap the functional layer hole TAH1, the second electrode hole TAH2, and the capping layer hole TAH3. Accordingly, the first inorganic encapsulation layer 310 may contact the top surface IILUS of the inorganic insulating layer IIL.

Referring to FIGS. 15A and 15B, the opening area OA may be formed in the substrate 100, the opening area OA overlapping the first region R1. According to some embodiments, the opening area OA may be formed in the first sub-region R1-1. According to some embodiments, because the first functional layer 212a, the second functional layer 212c, the second electrode 213, and the capping layer 215 are not exposed to the outside in the opening area OA, the penetration of moisture through one of the first functional layer 212a and the second functional layer 212c may be prevented or reduced.

Figure 16A:
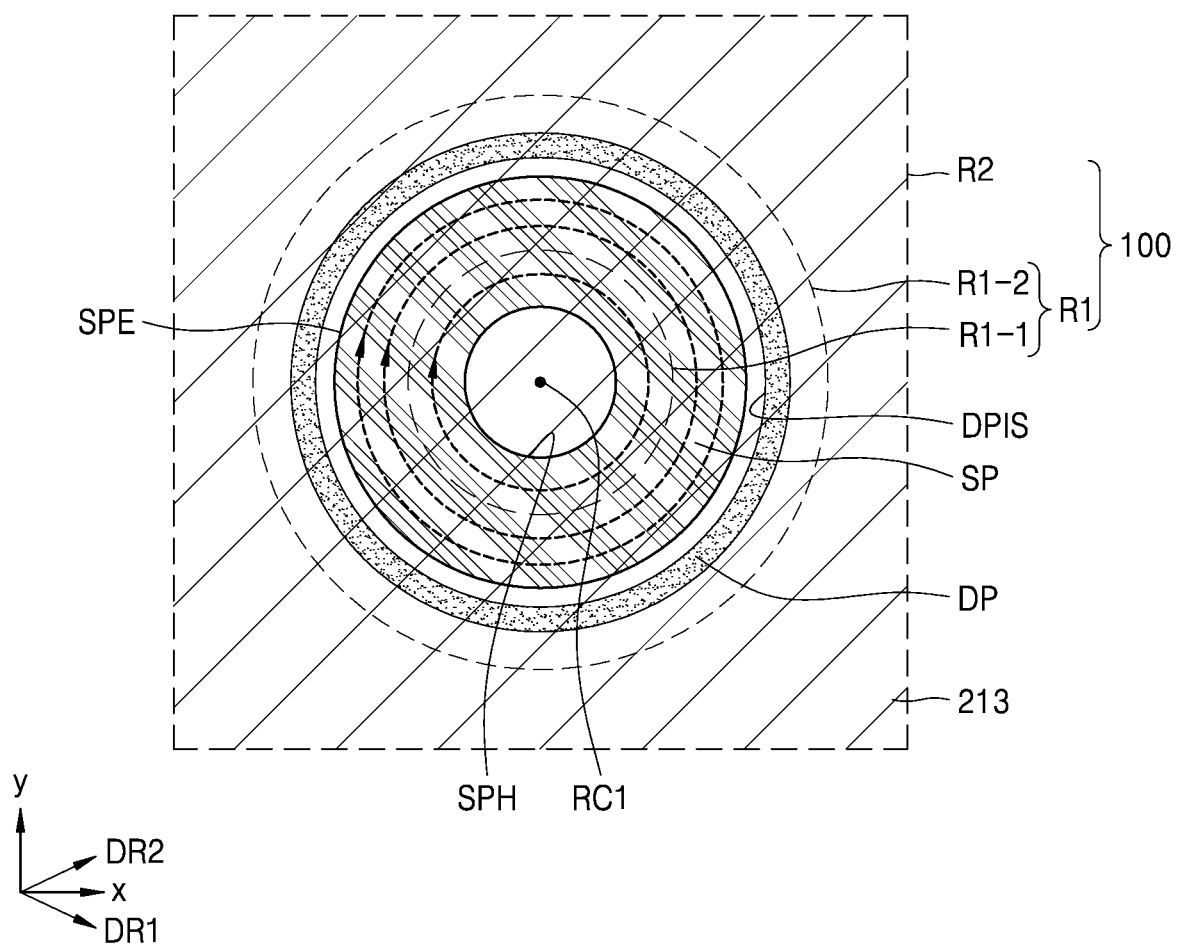
FIGS. 16A and 16B are plan views of a substrate and a sacrificial layer pattern according to a comparative example to be compared to an embodiment.
Figure 16B:
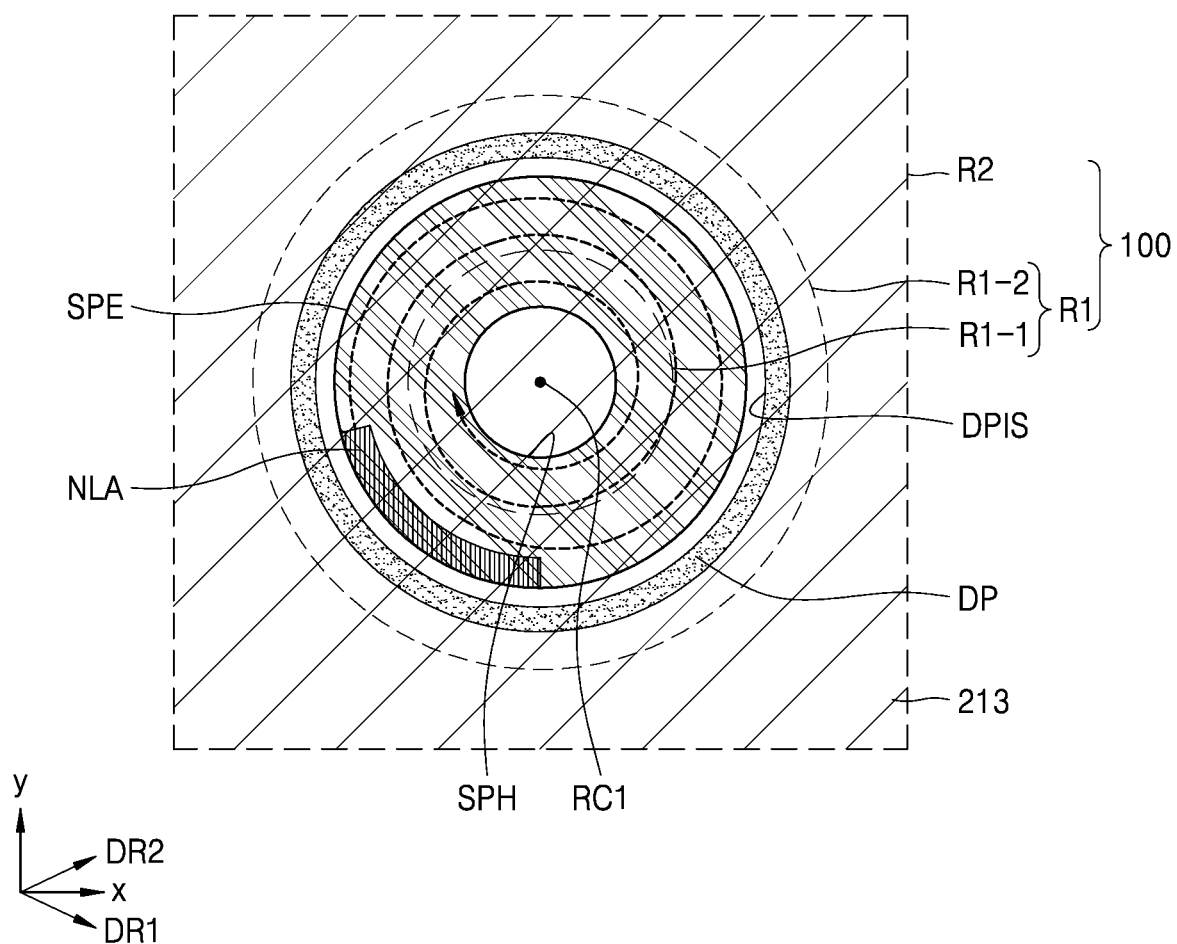

FIGS. 16A and 16B are plan views of the substrate 100 and the sacrificial layer pattern SP according to a comparative example to be compared to an embodiment. In FIGS. 16A and 16B, because the same reference numerals as those of FIG. 12A denote the same members, repeated descriptions thereof are omitted.

Referring to FIG. 16A, a laser irradiation path according to a comparative example may not be spiral. In this case, a start point of the laser irradiation may coincide with an end point of the laser irradiation, and energy due to the laser may be accumulated at the start point and/or the end point of the laser irradiation. Accordingly, the substrate 100 and the multi-layer on the substrate 100 may be damaged. In contrast, according to some embodiments, because the laser is irradiated along a spiral irradiation path, damage to the substrate 100 and the multi-layer on the substrate 100 may be prevented or reduced.

Referring to FIG. 16B, in a comparative example, a distance from the center RC1 of the first region R1 to the edge SPE of the sacrificial layer pattern SP may be constant in the peripheral direction of the sacrificial layer pattern SP. In this case, when the laser is irradiated along a spiral irradiation path, the laser may not be irradiated to a portion of the sacrificial layer pattern SP. As an example, the sacrificial layer pattern SP may include a non-laser area NLA to which the laser is not irradiated. In this case, moisture, etc. may penetrate the second region R2 through the functional layer arranged in the non-laser area NLA. Alternatively, the laser irradiation may be repeated in the sacrificial layer pattern SP.

According to some embodiments, in the sacrificial layer pattern SP, a first distance from the center RC1 of the first region R1 to the first edge portion may be different from a second distance from the center RC1 of the first region R1 to the second edge portion. That is, the edge of the sacrificial layer pattern SP may include at least one step difference. Accordingly, the sacrificial layer pattern SP according to some embodiments may not include the non-layer area NLA according to a comparative example. According to some embodiments, while the sacrificial layer pattern SP is formed, the non-layer area NLA may be patterned and removed. Accordingly, the penetration of moisture, etc. to the second region R2 through the functional layer arranged in the first region R1 may be prevented or reduced.

As described above, according to some embodiments, the organic layer arranged around the opening is removed through a laser-lift process, and thus, damage to display elements due to external moisture or foreign material may be prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display apparatus comprising:
a substrate including an opening area, a display area, and a non-display area, the display area surrounding the opening area, and the non-display area being between the opening area and the display area; and a display element in the display area and including a first electrode, an emission layer, and a second electrode that are sequentially stacked, wherein the second electrode extends from the display area to the non-display area and includes a second electrode hole defined by an edge of the second electrode that faces and surrounds the opening area, and a first distance from a center of the opening area to a first portion of the edge of the second electrode is different from a second distance from the center of the opening area to a second portion of the edge of the second electrode, wherein the first distance and the second distance are measured along a same plane that is parallel to a display surface of the display apparatus.

2. The display apparatus of claim 1, wherein, in a plan view, the edge of the second electrode has at least one step difference.

3. The display apparatus of claim 2, wherein the edge of the second electrode further includes a third portion that crosses each of the first portion and the second portion, and meets each of the first portion and the second portion.

4. The display apparatus of claim 1, further comprising:
a dam portion in the non-display area and surrounding the opening area,
wherein a third distance from an inner surface of the dam portion that faces the opening area, to the first portion is different from a fourth distance from the inner surface of the dam portion that faces the opening area, to the second portion.

5. The display apparatus of claim 1, further comprising:
a functional layer including at least one of a first functional layer or a second functional layer, the first function layer being between the first electrode and the emission layer, and the second functional layer being between the emission layer and the second electrode,
wherein the functional layer extends from the display area to the non-display area and includes a functional layer hole defined as an edge of the functional layer that faces and surrounds the opening area, and
a shape of the functional layer hole is a same as a shape of the second electrode hole.

6. The display apparatus of claim 1, further comprising:
an encapsulation layer covering the display element and including a first inorganic encapsulation layer, an organic encapsulation layer, and a second inorganic encapsulation layer,
wherein the first inorganic encapsulation layer and the second inorganic encapsulation layer extend from the display area to the non-display area to overlap the second electrode hole.

7. The display apparatus of claim 6, further comprising:
an inorganic insulating layer between the substrate and the display element,
wherein the first inorganic encapsulation layer contacts the inorganic insulating layer in the second electrode hole.

8. The display apparatus of claim 1, wherein, in a plan view, the edge of the second electrode that defines the second electrode hole includes a plurality of step differences.

9. The display apparatus of claim 1, wherein a distance from the center of the opening area to the edge of the second electrode that defines the second electrode hole is reduced in a peripheral direction of the second electrode hole.

10. The display apparatus of claim 1, further comprising a component overlapping the opening area.

* * * * *